United States Patent
Kim et al.

(10) Patent No.: US 12,086,428 B2
(45) Date of Patent: Sep. 10, 2024

(54) MEMORY CONTROLLER ADJUSTING POWER, MEMORY SYSTEM INCLUDING SAME, AND OPERATING METHOD FOR MEMORY SYSTEM

(71) Applicant: SAMSUNG ELECTRONICS CO., LTD., Suwon-si (KR)

(72) Inventors: Hyunseok Kim, Seoul (KR); Jingyu Heo, Yongin-si (KR); Inhae Kang, Seongnam-si (KR); Jaeyoul Oh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/839,388

(22) Filed: Jun. 13, 2022

(65) Prior Publication Data

US 2023/0152989 A1 May 18, 2023

(30) Foreign Application Priority Data

Nov. 15, 2021 (KR) .................. 10-2021-0157081
Dec. 22, 2021 (KR) .................. 10-2021-0185404

(51) Int. Cl.
*G06F 12/00* (2006.01)
*G06F 3/06* (2006.01)
*G06F 13/00* (2006.01)

(52) U.S. Cl.
CPC .......... *G06F 3/0625* (2013.01); *G06F 3/0653* (2013.01); *G06F 3/0679* (2013.01)

(58) Field of Classification Search
CPC ..... G06F 3/0625; G06F 3/0653; G06F 3/0679
(Continued)

(56) References Cited

U.S. PATENT DOCUMENTS 5,754,489 A 5/1998 Kim
7,817,488 B2 * 10/2010 Unger .................. G06F 1/3203
365/228

(Continued)

FOREIGN PATENT DOCUMENTS

JP 2017-531245 10/2017
KR 10-0167294 1/1999
(Continued)

OTHER PUBLICATIONS

Korean Office Action Dated Mar. 16, 2022 Cited in Korean Application No. 10-2021-0185404.
(Continued)

*Primary Examiner* — Sheng Jen Tsai
(74) *Attorney, Agent, or Firm* — Fish & Richardson P.C.

(57) ABSTRACT

An operating method for a memory system including a host and a memory system. The operating method may include; communicating maximum power information from the memory system to the host, communicating power table information and battery information from the host to the memory system in response to the maximum power information, and controlling power consumption by a component of the memory system in response to a maximum consumption power value, wherein each of the power table information and the battery information is related to a battery associated with the memory system and operating in accordance with battery steps, the power table information includes a number of entries including a first entry and a second entry, the first entry is related to a first battery step among the battery steps and associated with a first maximum consumption power value, the second entry is related to a second battery step among the battery steps and associated with a second maximum consumption power value, and the maximum consumption power value controlling power consumption by the component of the memory system is one of
(Continued)

| BATTERY STEP | MAX | AVG |
|---|---|---|
| 90~100 (STEP 1) | Pm-M1 | Pa-A1 |
| 80~90 (STEP 2) | Pm-M2 | Pa-A2 |
| ⋮ | ⋮ | ⋮ |
| 0~10 (STEP 10) | Pm-M10 | Pa-A10 |

( M1 < M2 ... < M10 )

the first maximum consumption power value and the second maximum consumption power value.

19 Claims, 18 Drawing Sheets

(58) Field of Classification Search
USPC .......................................................... 711/142
See application file for complete search history.

(56) References Cited

U.S. PATENT DOCUMENTS

| | | | |
|---|---|---|---|
| 8,694,719 B2 | 4/2014 | Lassa et al. | |
| 9,340,117 B2* | 5/2016 | Momose | B60L 53/68 |
| 9,575,536 B2 | 2/2017 | Rajappa et al. | |
| 9,672,046 B2* | 6/2017 | Subbareddy | G06F 9/44 |
| 10,126,794 B2* | 11/2018 | Bang | G06F 1/1626 |
| 10,732,864 B2* | 8/2020 | Sharma | G06F 3/065 |
| 10,838,807 B2* | 11/2020 | Parry | G06F 3/0619 |
| 10,891,075 B2 | 1/2021 | Chun et al. | |
| 10,964,401 B2* | 3/2021 | Benisty | G06F 1/28 |
| 11,036,426 B2 | 6/2021 | Jung | |
| 2002/0017567 A1* | 2/2002 | Connolly | G04B 47/00 235/472.02 |
| 2006/0015758 A1* | 1/2006 | Yoon | G06F 1/3203 713/300 |
| 2007/0103836 A1* | 5/2007 | Oh | G06F 1/3203 361/115 |
| 2007/0268203 A1* | 11/2007 | Moriwaki | G06F 3/1454 345/1.1 |
| 2008/0162770 A1* | 7/2008 | Titiano | G06F 1/3203 710/309 |
| 2010/0100757 A1* | 4/2010 | Takada | G06F 1/3221 713/340 |
| 2011/0007491 A1* | 1/2011 | Robinson | H02J 5/00 361/810 |
| 2011/0060927 A1* | 3/2011 | Fillingim | G06F 11/3034 713/320 |
| 2011/0208980 A1* | 8/2011 | Brooks | G06F 1/266 713/300 |
| 2011/0296088 A1* | 12/2011 | Duzly | G06F 12/0246 711/E12.001 |
| 2012/0066439 A1* | 3/2012 | Fillingim | G06F 3/0653 711/E12.008 |
| 2014/0237272 A1 | 8/2014 | Sadowski | |
| 2015/0089261 A1* | 3/2015 | Segawa | G06F 1/324 713/323 |
| 2016/0080652 A1* | 3/2016 | Shirota | G06K 7/1404 348/222.1 |
| 2016/0116932 A1* | 4/2016 | Yokoyama | H02J 3/00 700/295 |
| 2016/0170642 A1* | 6/2016 | Miyamoto | G06F 3/0655 711/103 |
| 2016/0283747 A1* | 9/2016 | Xing | G06F 21/602 |
| 2016/0378149 A1 | 12/2016 | Kam et al. | |
| 2017/0075610 A1* | 3/2017 | Choi | G06F 1/3275 |
| 2017/0300263 A1 | 10/2017 | Helmick | |
| 2018/0174123 A1* | 6/2018 | Zhu | G06Q 20/327 |
| 2019/0155538 A1 | 5/2019 | Kim et al. | |
| 2019/0227725 A1* | 7/2019 | Afriat | G06F 3/0683 |
| 2019/0235612 A1 | 8/2019 | Li et al. | |
| 2020/0233606 A1 | 7/2020 | Duan et al. | |
| 2020/0333870 A1* | 10/2020 | Vaysman | G06F 1/3275 |
| 2021/0157385 A1 | 5/2021 | Kwon et al. | |
| 2021/0294407 A1* | 9/2021 | Yu | G06F 1/3225 |
| 2021/0303184 A1 | 9/2021 | Palmer | |
| 2023/0004306 A1* | 1/2023 | Onishi | G06F 3/0656 |
| 2023/0127204 A1* | 4/2023 | Cho | G06F 3/0634 711/154 |
| 2023/0261331 A1* | 8/2023 | Morton | H01M 50/271 429/163 |

FOREIGN PATENT DOCUMENTS

| | | |
|---|---|---|
| KR | 10-2015-0070365 | 6/2017 |
| KR | 10-2020-0130011 | 11/2020 |
| KR | 10-2016-0104965 | 10/2021 |

OTHER PUBLICATIONS

Extended European Search Report in European Appln. No. 22189251.6, mailed on Sep. 20, 2023, 23 pages.
Compaq Hewlett-Packard: "Universal Serial Bus Specification", Apr. 27, 2000, XP055654219.
European Partial Search Report Dated Apr. 6, 2023, Cited in Corresponding EP Patent Application 22189251.6.

* cited by examiner

FIG. 6

| BATTERY STEP | MAX | AVG |
|---|---|---|
| 90~100 (STEP 1) | Pm-M1 | Pa-A1 |
| 80~90 (STEP 2) | Pm-M2 | Pa-A2 |
| ⋮ | ⋮ | ⋮ |
| 0~10 (STEP 10) | Pm-M10 | Pa-A10 |

( M1 < M2 ... < M10 )

MEMORY CONTROLLER ADJUSTING POWER, MEMORY SYSTEM INCLUDING SAME, AND OPERATING METHOD FOR MEMORY SYSTEM

CROSS-REFERENCE TO RELATED APPLICATIONS

This application claims the benefit under 35 U.S.C. § 119 of Korean Patent Applications No. 10-2021-0157081 filed on Nov. 15, 2021, and Korean Patent Applications No. 10-2021-0185404 filed on Dec. 22, 2021, the collective subject matter of which is hereby incorporated by reference.

BACKGROUND

The inventive concept relates to memory controllers and memory systems including same. More particularly, the inventive concept relates to memory controllers capable of performing a power adjusting operation and memory systems including such memory controllers.

Memory systems may be broadly classified as volatile or non-volatile in accordance with their operative nature. A non-volatile memory system is able to retain stored data in the absence of applied power, whereas data is lost from a volatile memory system when power is interrupted. A non-volatile memories may include, for example, a read-only memory (ROM), a magnetic disk, an optical disk, flash memory, a resistive random access memory (RAM) (RRAM), a phase-change RAM (PRAM), and/or a magneto-resistive RAM (MRAM). A solid-state drive (SSD) including one or more non-volatile memories is commonly used in memory systems applied to a variety of electronic devices.

Power supply issues are particularly critical in many portable electronic devices (e.g., a mobile device powered by a battery). Because the power-supplying capacity of a battery is limited, power consumption should be carefully managed. However, when power provided to a memory system is reduced, performance of a constituent memory system is degraded, thereby resulting in degraded overall performance of the electronic device.

SUMMARY

Embodiments of the inventive concept provide memory controllers capable of efficiently managing power consumption by a memory system included within an electronic device. Other embodiments of the inventive concept provide memory systems including such memory controllers, and operating methods for such memory controllers.

According to an aspect of the inventive concept, an operating method for a memory system may include; communicating maximum power information from the memory system to the host, communicating power table information and battery information from the host to the memory system in response to the maximum power information, and controlling power consumption by a component of the memory system in response to a maximum consumption power value, wherein each of the power table information and the battery information is related to a battery associated with the memory system and operating in accordance with battery steps, the power table information includes a number of entries including a first entry and a second entry, the first entry is related to a first battery step among the battery steps and associated with a first maximum consumption power value, the second entry is related to a second battery step among the battery steps and associated with a second maximum consumption power value, and the maximum consumption power value controlling power consumption by the component of the memory system is one of the first maximum consumption power value and the second maximum consumption power value.

According to an aspect of the inventive concept, an operating method for a memory system may include; communicating maximum power information and step information to a host, receiving battery power table information from the host, calculating a first maximum consumption power value for the component in response to the battery power table information, receiving a first read/write request from the host and performing a first read/write operation using the component in a high performance, high power consumption mode as defined by the first maximum consumption power value, receiving updated battery power table information from the host, calculating a second maximum consumption power value for the component in response to the updated battery power table information, and receiving a second read/write request from the host and performing a second read/write operation using the component in a low performance, low power consumption mode as defined by the second maximum consumption power value.

According to an aspect of the inventive concept, a memory controller configured to communicate with a host and a memory device may include; a central processing unit (CPU) core configured to control a memory operation performed by the memory device, and a storage circuit configured to store battery power table information received from the host, wherein the battery power table information includes a plurality of entries, each entry among the plurality of entries is respectively related to a battery step among a plurality of battery steps, and each battery step is respectfully related to a range of residual battery power, wherein the memory controller is further configured to communicate maximum power information and step information to the host, receive the battery power table information, and adjust power consumption by the memory system in relation to at least one of a maximum consumption power value and an average consumption power value defined in the battery power table information.

BRIEF DESCRIPTION OF THE DRAWINGS

Advantages, benefits, and features, as well as the making and use of the inventive concept, may be more clearly understood upon consideration of the following detailed description together with the accompanying drawings, in which:

FIG. 6 is a diagram of table information according to an example embodiment;

DETAILED DESCRIPTION

Throughout the written description and drawings, like reference numbers and labels are used to denote like or similar elements, components and/or methods steps.

Figure 1:
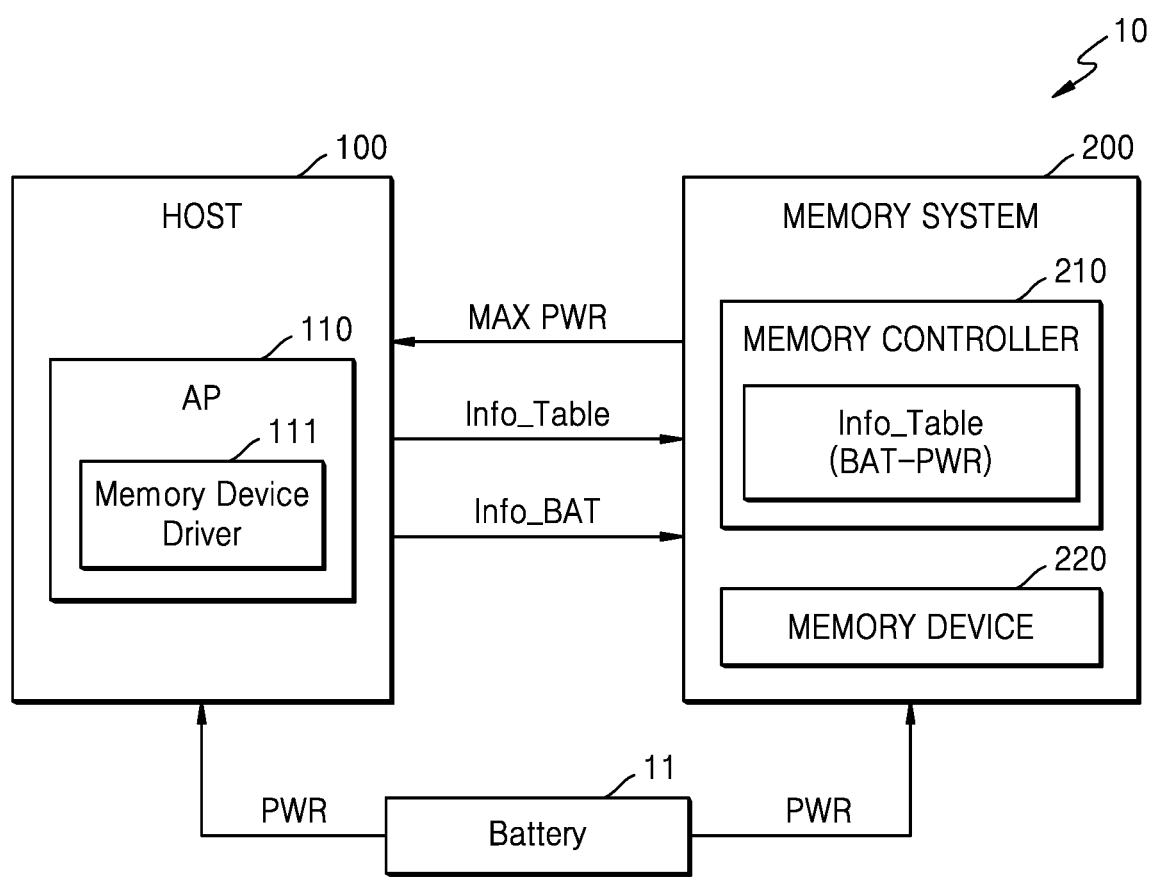
FIG. 1 is a block diagram illustrating an electronic device including a memory system, according to an example embodiment.

FIG. 1 is a block diagram illustrating an electronic device 10 including a memory system according to embodiments of the inventive concept. Within the context of certain embodiments, an electronic device including a memory system according to embodiments of the inventive concept may be understood as a data processing system capable of performing various data access operations (e.g., read operations, write (or program) operations, etc.) in relation to the memory system.

As shown in FIG. 1, the electronic device 10 may generally include a host 100 and a memory system 200. The electronic device 10 may be variously implemented as, for example, a personal computer (PC), a data server, a network-coupled storage, an Internet of Things (IoT) device, or a portable electronic device (e.g., a laptop computer, a mobile phone, a smartphone, a tablet PCs, a personal digital assistants (PDA), an enterprise digital assistants (EDA), a digital still camera, a digital video camera, an audio device, a portable multimedia player (PMP), a personal navigation device (PND), an MPEG-1 audio layer 3 (MP3) player, a handheld game console, an electronic book (or e-book), a wearable device, etc.).

The host 100 may include an application processor (AP) and/or a System-on-Chip (SoC). The memory system 200 may communicate (e.g., transmit and/or receive) information with the host 100 using a variety of interfaces and corresponding protocols, such as for example; a universal serial bus (USB), a multimedia card (MMC), an embedded MMC (eMMC), peripheral component interconnect (PCI), PCI-express (PCI-E), advanced technology attachment (ATA), serial ATA (SATA), parallel-ATA (PATA), a small computer system interface (SCSI), an enhanced small device interface (ESDI), an intelligent drive electronics (IDE), Firewire, a universal flash storage (UFS), and/or a non-volatile memory express (NVMe).

In this regard, the term "information" should be broadly construed to denote one or more analog and/or digital signals. Further in this regard, information communicated between the host 100 and memory system 200 within the electronic device 10 may be variously defined, for example, according to one or more conventionally-understood and commercially-available technical standards. (See, e.g., the interfaces and corresponding protocols listed above).

The memory system 200 may include at least one non-volatile memory device, such as for example; a NAND flash memory, a vertical NAND (VNAND) flash memory, a NOR flash memory, a RRAM, a PRAM, and a MRAM. In some embodiments, the memory system 200 may be implemented as a solid-state drive (SSD) or a memory card (e.g., an eMMC, a secure digital (SD), a micro-SD, and a UFS). Hereinafter, various embodiments of the inventive concept will be described under an assumption that the memory system 200 of FIG. 1 is SSD including multiple flash memory chips. Within the context of certain embodiments of the inventive concept, the memory system 200 may be generally understood as a storage device capable of accessing data corresponding to various information.

The host 100 is assumed to include an AP 110 which includes various intellectual properties (IPs). For example, the host 100 may include, as one exemplary IP, a memory device driver 111 configured to control the overall operation of the memory system 200. The host 100 and the memory system 200 may communicate information, such as various request(s) from the host 100 to the memory system 200 and response(s) associated with the request(s).

Moreover, the memory system 200 may include a memory controller 210 and a memory device 220. The memory controller 210 may receive requests related to a memory operation from the host 100, generate commands/addresses and clock signals in response to the requests, and provide the commands/addresses/control signal and clock signals to the memory device 220. The memory device 220 may then write data in a memory cell array and/or retrieve data from the memory cell array and provide same to the memory controller 210 in response to the commands/addresses.

In some embodiments, various information may be communicated between the host 100 and the memory system 200 using an in-band command and/or a side-band command. In this regard, the memory system 200 may variably consume power (e.g., power supplied from a constituent battery of a portable electronic device) during the performance (or execution) of various operations (e.g., data access operations, housekeeping operations, etc.). Hence, performance specifications for the memory system 200 are integrally related to various power consumption parameters, and corresponding types of performance-related and power-related information may be communicated between the memory system 200 and the host 100.

For example, the memory system 200 may have maximum power consumption parameter(s) indicated by "maximum power information" (or MAX_PWR) that may be communicated to the host 100 (e.g., upon power-up of the electronic device 10 or upon request by the host 100). Further, upon receipt of the maximum power information MAX_PWR from the memory system 200, the host 100 may generate "power table information" (Info_Table) in response to the maximum power information MAX_POWER, and communicate the power table information Info_table to the memory system 200.

Thus, during an initialization operation (e.g., part of an overall system booting operation for the electronic device 10), the host 100 may receive the maximum power information MAX_PWR from the memory system 200, and return corresponding power table information Info_table to the memory system 200. The memory system 200 may then store the power table information Info_table therein. Alternately, during run-time operation of the electronic device 10, the maximum power information MAX_PWR and the power table information Info_table may exchanged between the host 100 and the memory system 200.

The electronic device 10 of FIG. 1 includes a battery 11, wherein the host 100 and the memory system 200 receive power (PWR) from the battery 11. In some embodiments, in order efficiently manage power consumption by the electronic device 10 and extend battery life, power supplied to (or consumed by) the memory system 200 may be variously limited In some approaches to the overall management of power, the host 100 may generate the power table information Info_table to include a number "table entries" respectively corresponding one or more battery steps. For example, each table entry in the power table information Info_table may correspond to a battery step, wherein each "battery step" may be associated with a range of residual battery power (e.g., 90 to 100%; 80 to 90%; 70 to 80%; . . . 0 to 10%) for the battery 11. In some embodiments, each table entry (and therefore each battery step) may indicate "maximum consumption power information" (e.g., information indicating a current maximum power level) and/or "average consumption power information" (e.g., information indicating an average power level) for the memory system 200.

In this regard, the host 100 may periodically detect a residual (or remaining) power level of the battery 11, generate corresponding "battery information" (Info_BAT) in response to the residual power level detection, and then communicate the battery information Info_BAT to the memory system 200. Thus, consistent with this approach, each battery step, as indicated by a corresponding entry in the power table information, may be include information associated with a range of residual battery power, as indicated by the battery information Info_BAT. Alternately, each battery step may include step information corresponding to residual battery power, and the battery information Info_BAT may indicate a corresponding one of the battery steps.

Further in this regard, the memory system 200 may check (e.g., compare) the power table information Info_table in relation to the battery information Info_BAT received from the host 100, and adjust a maximum power level and/or an average power level for the memory system 200 in response to (or based on) an entry corresponding to the received battery information Info_BAT. For example, as residual battery power for the battery 11 falls, an adjustment operation may be periodically performed, such that the maximum power level and/or the average power level for the memory system 200 reduced accordingly.

From the foregoing, those skilled in the art will appreciate that the memory system 200, in a variety of possible implementations, may include a number of constituent components. That is, a circuit or element that consumes a discernable amount of power may be identified as a "component" of the memory system 200. For example in the context of FIG. 1, each of the memory controller 210 and the memory device 220 may be understood as being a component of the memory system 200. However, some of the elements within the memory controller 210 and/or some of the elements within the memory device 220 may be further understood as being respective component(s). For example, a central processing unit (CPU) core of the AP 110, a volatile memory (e.g., a dynamic RAM (DRAM) or a static RAM (SRAM)) included in the memory controller 210, and/or respective flash memory chips included in the memory device 220 may understood as respective components in relation to the management of power within the electronic device 10.

As will be described hereafter by way of examples, the power consumption of the memory system 200 may be managed (or adjusted) in various ways in relation to use of the power table information Info_table provided by the host 100. Thus, average consumption power and/or maximum consumption power for the memory system 200 may be adjusted by managing the respective power levels (or amounts) for one or more of a number of memory system components. For example, the memory controller 210 may provide a clock signal having a first (or nominal) frequency to the memory device 220 in order to control data access operations performed by flash memory chips included in the memory device 220. However, the first frequency of the clock signal may be reduced to a lower second (or power-saving) frequency in order to reduce power consumption by the memory device 220. Alternately, a maximum number of flash memory chips within the memory device 220 capable of being simultaneously accessed by the memory controller 210 may be reduced.

Figure 2:
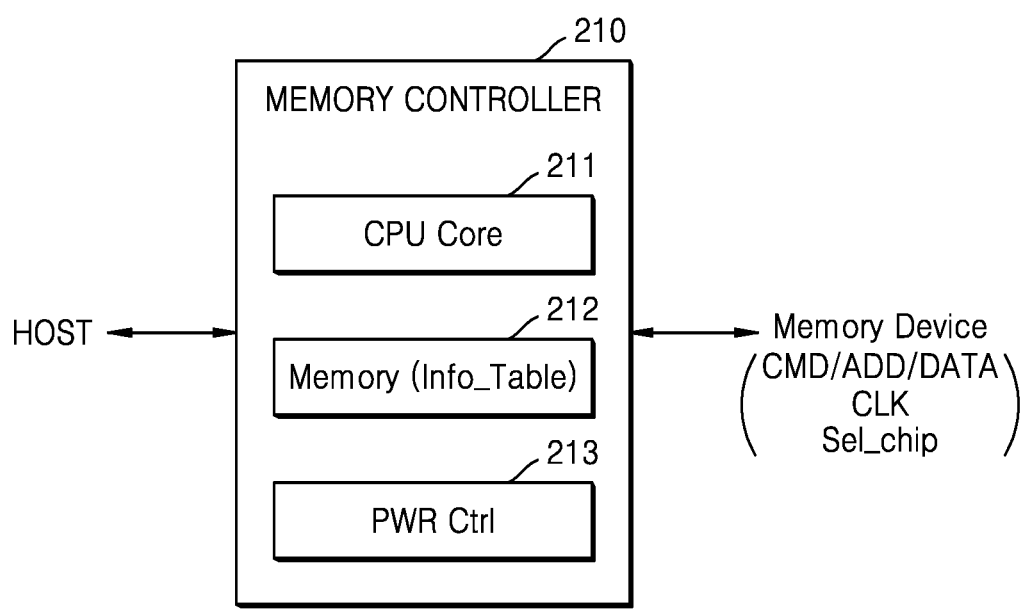
FIG. 2 is a block diagram of an example of a memory controller of FIG. 1 according to an example embodiment.

FIG. 2 is a block diagram further illustrating in one embodiment the memory controller 210 of FIG. 1.

Referring to FIGS. 1 and 2, the memory controller 210 is assumed to include a CPU core 211, a memory 212 storing power table information Info_table, and a power controller (PWR Ctrl) 213. The CPU core 211 may be used to control operation of the memory controller 210 in response to request(s) received from the host 100. For example, under the control of the CPU core 211, the memory controller 210 may communicate a variety of command(s) CMD, address(es) ADD, data DATA, clock signal(s) CLK, and/or control signals (e.g., a chip selection signal Sel_chip) (hereafter singularly or collectively, "control/address/data signal" or a "CAD signal") to the memory device 220 in order to perform various data access operations. Optionally, the maximum power information MAX_PWR may be stored in the memory 212 and/or some other memory associated with the host 100.

The power controller 213 may provide one or more control signals among the CAD signals communicated to the memory device 220 that may be used to variously adjust power consumption by the memory system 200 in response to the power table information Info_table stored in the memory 212. That is, the memory controller 210 may adjust one or more of the CAD signal(s) so as to vary one or more operating characteristics of one or more components of the memory system 200. Further, the CPU core 211 may internally adjust one or more core performance characteristics and/or internal component power consumption under the control of the power controller 213.

In the illustrated embodiment of FIG. 2 the power controller 213 is used to generate various control signals that adjust power consumption under the control of the CPU core 211, however the inventive concept is not limited thereto. Alternately, the power table information Info_table may be referred to by the CPU core 211, and various components of the memory controller 210 may be controlled to adjust power consumption under the control of the CPU core 211.

Figure 3:
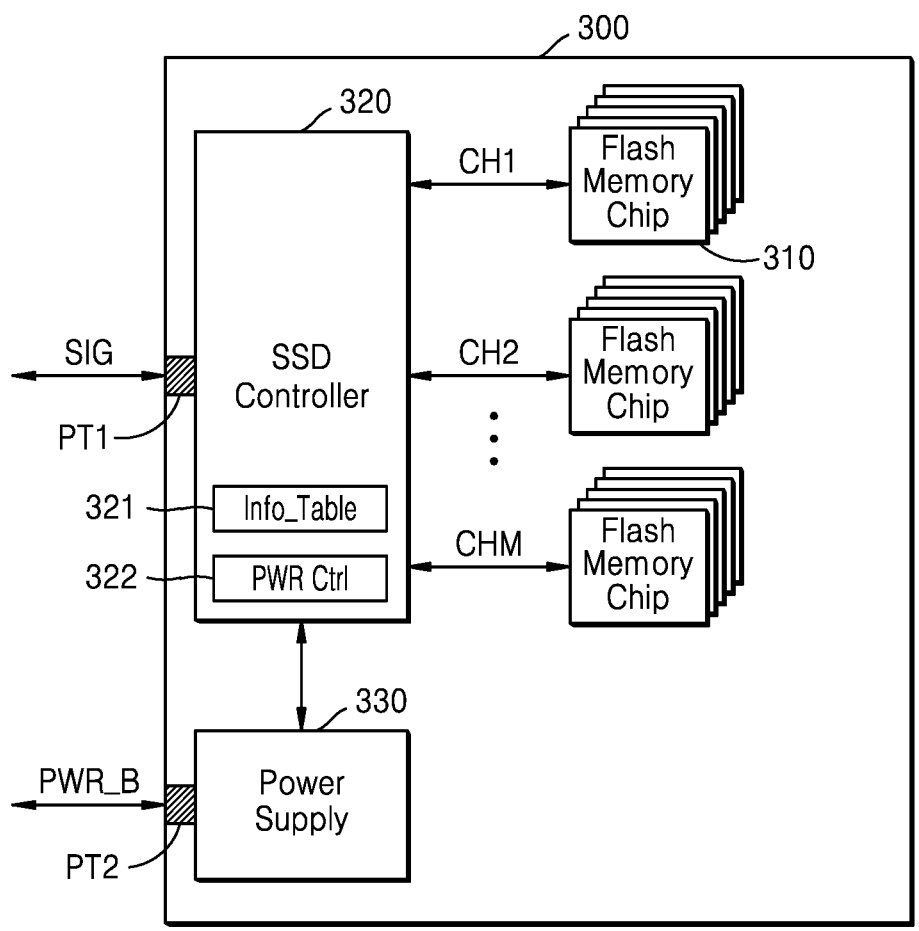
FIG. 3 is a block diagram of an example of the memory system of FIG. 1 as a solid-state drive (SSD) according to an example embodiment.

FIG. 3 is a block diagram illustrating a SSD 300, as one possible example of the memory system 200 of FIG. 1.

Referring to FIGS. 1 and 3, the SSD 300 generally includes flash memory chips 310, an SSD controller 320, and a power supply 330, wherein the power supply 330 receives a battery power signal (PWR_B) from the battery 11 in the electronic device 10, and in response to the battery power signal PWR_B, the power supply 330 may generate one or more internal power signals variously applied to one or more component(s) of the SSD 300.

The SSD controller 320 may control the flash memory chips 310 in response to a signal SIG (e.g., a CAD signal) received from the host 100 through a first port PT1. The power signal PWR_B may be received through a second port PT2. In some embodiments, the SSD controller 320 may be connected to the flash memory chips 310 through one or more channels (e.g., channels CH1 to CHM, where 'M' is a positive integer).

The SSD controller 320 may include a memory 321 storing the power table information Info_table, and a power controller 322 controlling the operation of the power supply 330. In this regard, the SSD controller 320 may include one or more CPU core(s). The SSD controller 320 may be used to communicate the maximum power information MAX PWR from the SSD 300 to the host 100, and communicate the power table information Info_Table (e.g., including entries associated with various battery steps and corresponding consumption power information) from the host 100 to the SSD 300.

That is, in some embodiments, the SSD controller 320 may store the power table information Info_table and the battery information Info_BAT in a memory internal to the SSD controller 320, wherein such information may be periodically or asynchronously received from the host 100. In response to the received battery information Info_BAT and the power table information Info_table, the SSD controller 320 may control the power supply 330 through the power controller 322 in order to variously adjust the internal power signal(s) provided by the power supply 330. Alternately or additionally, in response to the received battery information Info_BAT and the power table information Info_table, the SSD controller 320 may perform one or more power control operation(s), such as adjusting a frequency of a clock signal within the SSD 300 or changing a maximum number of flash memory chips 310 simultaneously accessed by the SSD controller 320.

Figure 4:
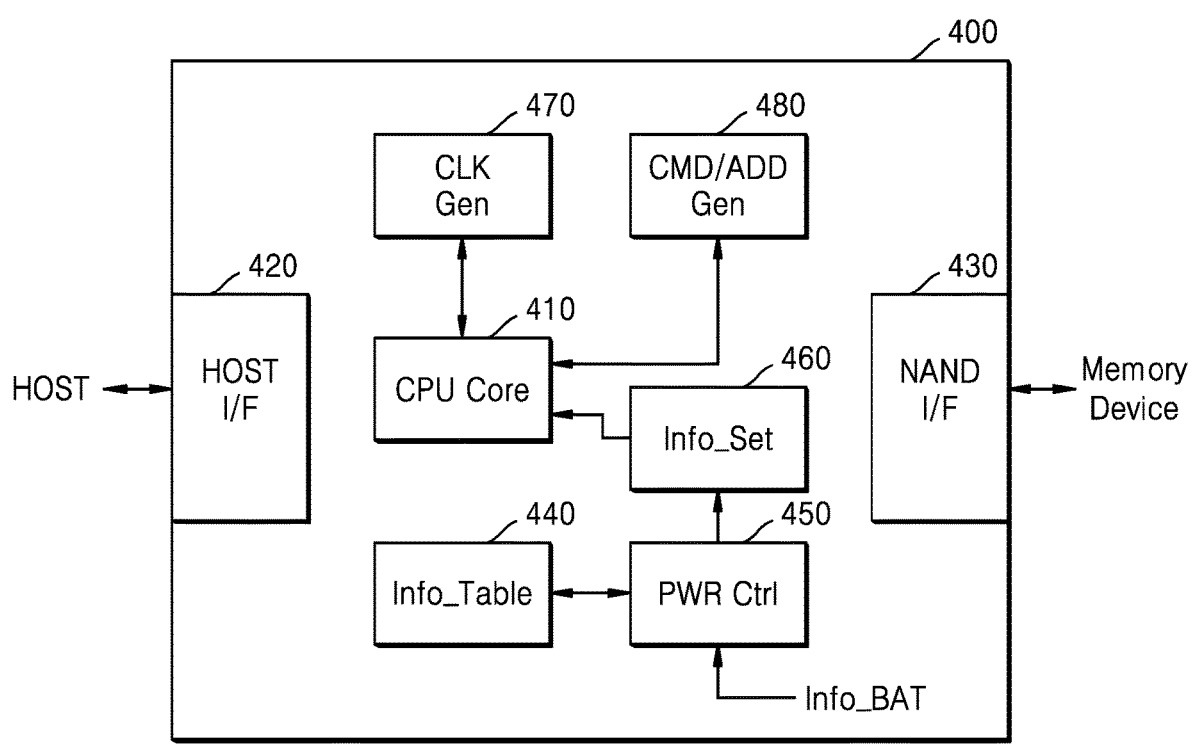
FIG. 4 is a block diagram of an example of a memory controller according to an example embodiment.

FIG. 4 is a block diagram illustrating a memory controller 400, as one possible example of the memory controller 210 of FIG. 1.

Referring to FIGS. 1 and 4, the memory controller 400 may include a CPU core 410, a host interface (I/F) 420, and a memory interface (I/F) 430. Here, the CPU core 410 may be used to control the overall operation of the memory controller 400. The host interface 420 may be used to control communication of CAD signal(s) with the host 100 using one or more protocol(s), such as SATA, serial attached SCSI (SAS), NVMe, USB, UFS, etc. The memory interface 430 may be used to control communication of CAD signal(s) with the memory device 220, wherein the communicated CAD signal(s) may control the operation of the memory device 220.

In some embodiments, the memory controller 400 may further include a first memory 440 storing the power table information Info_table, a power controller 450, a second memory 460 storing various configuration (or setting) information Info_set related to the operation of various components, a clock generator 470, and a command/address generator 480. In some embodiments, each of the memory first and the second memory 440 and 460 may include one or more volatile memories, such as a DRAM, a SRAM, and various registers. Although FIG. 4 shows separate first and second memories 440 and 460 storing the power table information Info_table and the setting information Info_set, those skilled in the art will appreciate that various memory configurations (e.g., a single memory) may be used store the power table information Info_table, the setting information Info_set, and other types of control and/or intermediate data. Thus, in response to the battery information Info_BAT received from the host 100 and the power table information Info_table stored in the first memory 440, the power controller 450 of the memory controller 400 may store various "configuration and/or control information" (e.g., including the setting information Info_set) in the second memory 460, wherein the configuration and/or control information may subsequently be used to control power consumption by the memory system 200.

In this regard, adjustments to the power consumption of the memory system 200 may be performed on a system basis and/or a component basis. For example, the CPU core 410 may be used to adjust power consumption by adjusting operating characteristics of various components included in the memory system 200 in response to the setting information Info_set stored in the second memory 460. Alternately or additionally, power consumption of the memory system 200 may be controlled by the CPU core 400 to avoid exceeding a maximum consumption power and/or in relation to an average consumption power, as defined by an applicable entry of the power table information Info_table and/or the battery information Info_BAT.

In some embodiments, the clock generator 470 may generate at least one clock signal that is applied to one or more components of the memory controller 400, and/or one or more components of the memory device 220. Here, the frequency of the at least one clock signal may be determined by the battery information Info_BAT received form the host 100.

Further in this regard, power consumption by the memory system 200 may be varied by changing (e.g., increasing or decreasing) the frequency of the at least one clock signal within limits consistent with (e.g.,) the maximum power consumption and/or the average power consumption values. Alternately or additionally, the command/address generator 480 may be used to generate command/address CMD/ADD signals controlling access to the flash memory chips of the memory device 220, and therefore the command/address generator 480 may be used to further adjust power consumption by the memory system 200 by varying a number of flash memory chips that are simultaneously accessed, again within limits consistent with (e.g.,) the maximum power consumption and/or the average power consumption values.

Figure 5:
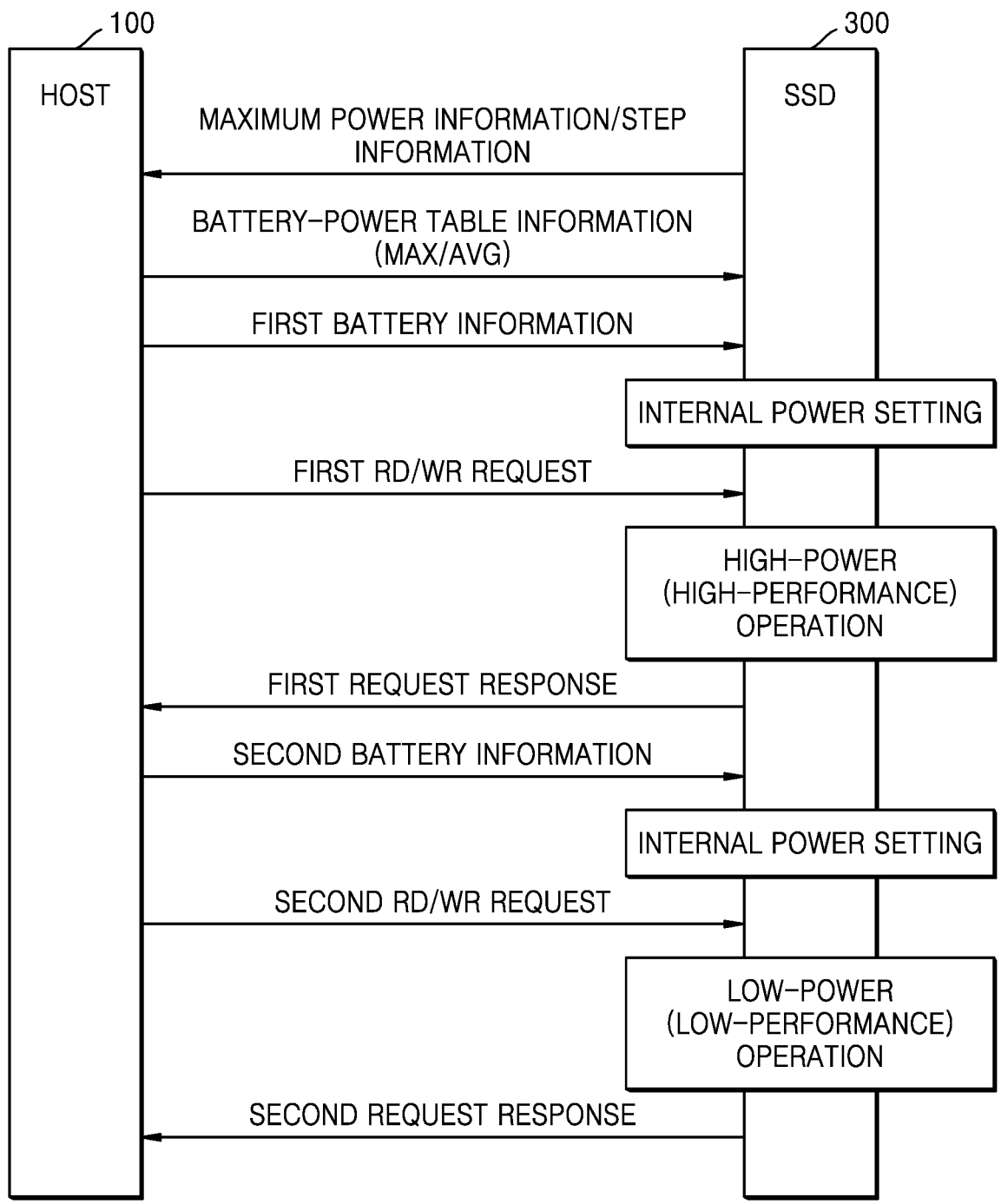
FIG. 5 is a diagram of an example of an operation of an electronic device including a memory system, according to an example embodiment.

FIG. 5 is a conceptual diagram illustrating an exemplary exchange of information and CAD signal(s) between the host 100 and the memory system 200 (or the SSD 300) according to embodiments of the inventive concept.

Referring to FIGS. 1, 3 and 5, upon initialization of the electronic device 10, the SSD 300 of FIG. 3, serving as the memory system 200 of FIG. 1, may provide the host 100 with maximum power information MAX PWR and . Here, it is assumed that power consumption by the SSD 300 may be controlled (or adjusted) in relation to N battery steps, wherein 'N' is an integer greater than 1. Thus, in some embodiments, the SSD 300 may provide step information associated with the N battery steps to the host 100 along with the maximum power information MAX PWR.

The host 100 may then generate power table information Info_Table in relation to the maximum power information and the step information received from the SSD 300, and return the power table information Info_Table to the SSD 300. In this regard, the host 100 may generate various entries for the power table information Info_Table in response to the number of power steps in which the SSD may be adjusted. In some embodiments, the number of power steps may correspond to the number of entries in the power table information Info_Table, but this need not always be the case. In some embodiments, each of the entries may include maximum consumption power information MAX and average consumption power information AVG corresponding to a battery step. The SSD 300 may then store the received power table information Info_Table in an internal memory.

Thereafter, when the SSD 300 operates normally (e.g., in a default mode of operation), the SSD may perform various memory access operations in response to requests received form the host 100. The host 100 may also periodically or asynchronously communicate battery information Info_BAT to the SSD 300, wherein the battery information Info_BAT includes at least information indicating residual battery power. For example, a first (e.g., an initial) battery information Info_BAT may indicate relatively high residual battery power.

In response to the first battery information Info_BAT and the power table information Info_Table, the SSD 300 may perform a first internal power setting operation. For example, assuming an indication of high residual battery power, the first internal power setting operation may increase power consumption by the SSD 300. Accordingly, data access operations may be performed under the first power setting at relatively high power and with high performance in response to first (or normal) read/write (RD/WR) requests received from the host 100.

Thereafter, the SSD 300 may provide the host 100 with a first request response in relation to the first RD/WR request received from the host 100. Accordingly, when a first RD/WR operation is performed at high power and with high performance, the SSD 300 may provide a first request response to the host 100 with relatively short latency.

However, at some point thereafter, the host 100 may provide a second battery information Info_BAT indicating relatively low residual battery power amount to the SSD 300. In response to the second battery information Info_BAT, the SSD 300 may perform a second internal power setting operation in relation to updated battery information and/or updated power table information Info_Table.

Thus, when residual battery power becomes relatively low, the second internal power setting operation may be performed to reduce power consumption by the SSD 300. Accordingly, data access operations may be performed at low power and with low performance in response to a second RD/WR requests received from the host 100. Thereafter, the SSD 300 may provide the host 100 with a second request response to the second RD/WR request. However, when a second RD/WR operation is performed at low power and with low performance, the SSD 300 may provide to the host 100 a request response having a relatively long latency.

FIG. 6 is a conceptual diagram illustrating, in part, power table information Info_Table according to embodiments of the inventive concept.

Referring to FIGS. 1 and 6, it is assume that the memory system 220 (e.g., SD 300 of FIG. 3) may adjust power consumption according to ten (10) battery steps. Thus, in some embodiments, it is further assumed that the host 100 provides power table information Info_Table including ten (10) entries to the memory system 220.

As shown in FIG. 6, the power table information Info_Table may include 10 battery steps and 10 corresponding entries for respective 10% intervals of residual battery power (e.g., 90% to 100% for battery step 1; 80% to 90% for battery step 2; and so on down to, 0% to 10% for battery step 10).

Here, each entry (and therefore each battery step in the working example of FIG. 6) in the power table information Info_Table includes a maximum consumption power value and an average consumption power value. However, this is just one convenient example and various entries of power table information Info_Table may include any reasonable number of values related to various power consumption factors.

But referring to FIG. 6, the illustrated example provides both maximum consumption power information (or value) and average consumption power information (or value) corresponding to each battery step. In this regard, assuming that maximum power that may be consumed by the memory system 220 (or maximum power information provided by the memory system 200 to the host 100) has a value of 'Pm', a maximum consumption power value corresponding to battery step 1 may equal (Pm−M1), wherein 'M1' may be understood as a first maximum power offset for the first battery step 1. Further, assuming that a maximum value of average consumption power that may be consumed by the memory system over a predetermined period is 'Pa', average consumption power corresponding to step 1 may equal (Pa−A1), wherein 'A1' may be understood as a first average power offset for battery step 1. Here, 'M1' and 'A1' may have respective, non-negative values.

The same relationships extend to respective maximum power offsets (e.g., M2, M3, M4, M5, M6, M7, M8, M9 and M10), wherein M1 is less than M2, which is less than M3, and so on through M9 which is less than M10, and respective average power offsets (e.g., A2, A3, A4, A5, A6, A7, A8, A9 and A10) for battery steps 2 through 10.

Figure 7:
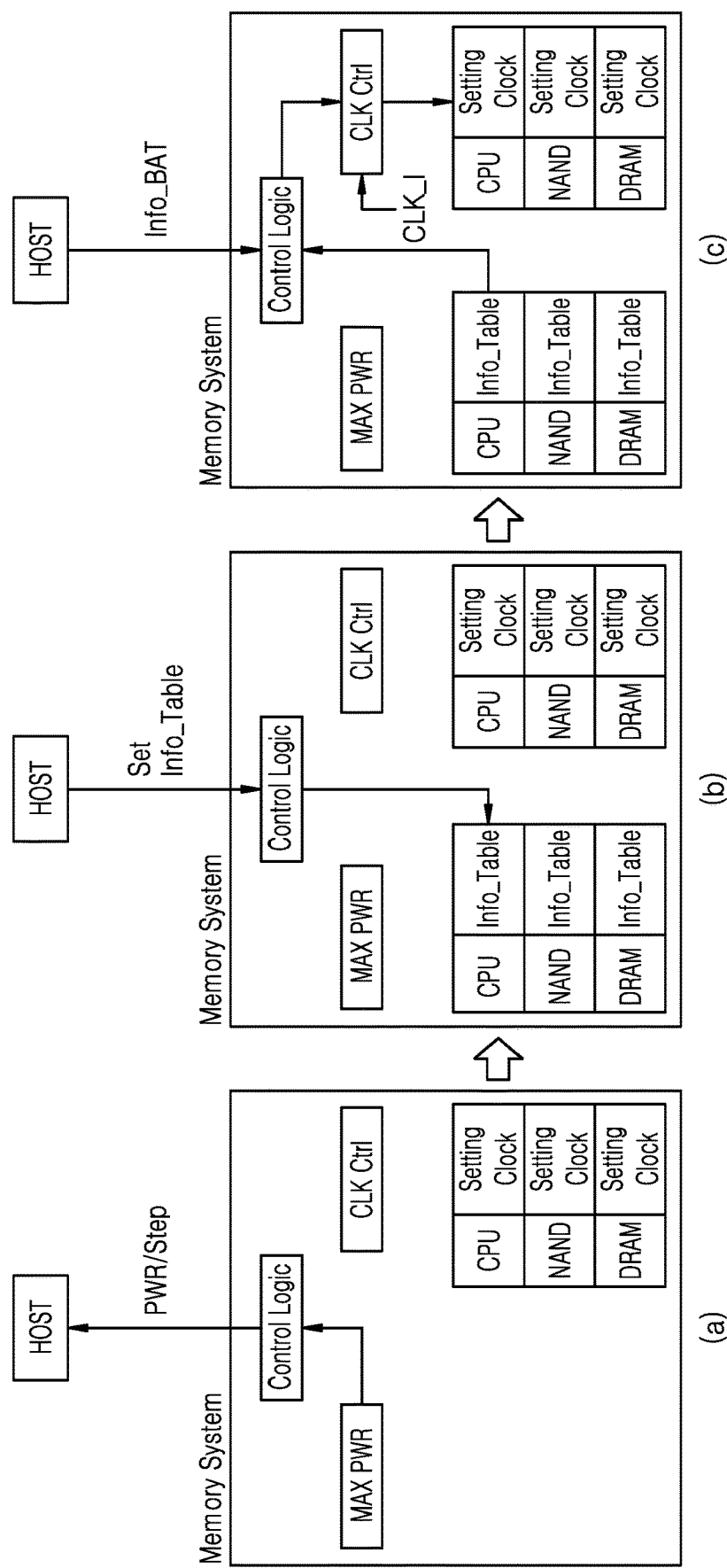
FIG. 7 depicts block diagrams of an example of a power control operation of a memory controller, according to an example embodiment.

FIG. 7 depicts block diagrams illustrating power control operations that may be performed by control logic according to embodiments of the inventive concept.

Initially, as shown at (a) of FIG. 7, a memory system may provide maximum power information PWR and battery step information Step to a host (HOST) through control logic (e.g., a memory controller, a CPU core, etc.) associated with the memory system. The host may then generate power table information Info_table in response to the maximum power information PWR and step information Step received from the memory system.

Then, as shown at (b) of FIG. 7, the host may communicate the power table information Info_table to the memory system, and the control logic of the memory system may store the received power table information Info_table in a memory or register associated with the memory system.

As noted above, the power table information Info_table may be variously configured and communicated in relation to one or more protocols. For example, the power table information Info_table may include multiple entries, wherein each entry includes power information corresponding to at least one battery step. Further, the memory system may include various components, and the power table information Info_table may include power information relate to one or more of the components. For example, the power table information Info_table provided from the host may include information related to power consumed by a CPU (or a CPU core), information related to power consumed by a first memory (e.g., a NAND flash memory), and/or information related to power consumed by a second memory (e.g., a DRAM).

Thereafter, as shown at (c) of FIG. 7, the host may periodically or asynchronously update battery information Info_BAT and provide same to the memory system. In this regard, the memory system may control power consumption in response to updated battery information Info_BAT and/or updated the power table information Info_table.

As previously noted, memory systems according to embodiments of the inventive concept may adjust power consumption using a variety of approaches, including for example; varying clock signal frequencies, turning components ON/OFF, varying power supply levels for power signals applied to various components, varying control settings for various components, varying operating speeds, varying a number or type of memory chips that may be accessed or accessed simultaneously, etc. Such power consumption variations may be made in relation to maximum consumption power value(s) and/or average consumption power value(s) indicated in the power table information Info_table.

In the illustrated example at (c) of FIG. 7, power consumption is adjusted by adjusting the frequency of a clock signal generated by a memory controller including a clock generator. Thus, in accordance with an entry of the power table information Info_table corresponding to the battery information Info_BAT provided from the host, a control operation may be performed that adjusts power consumption in relation to an average consumption power value and/or a maximum power consumption value. In this regard, the clock generator may adjust the frequency of an input clock signal (CLK_I) under the control of the control logic. Further in this regard, the resulting clock signal(s) may be used in relation to the control logic (e.g., a memory controller), the NAND, and/or the DRAM, as well as other components of the memory system.

Figure 8:
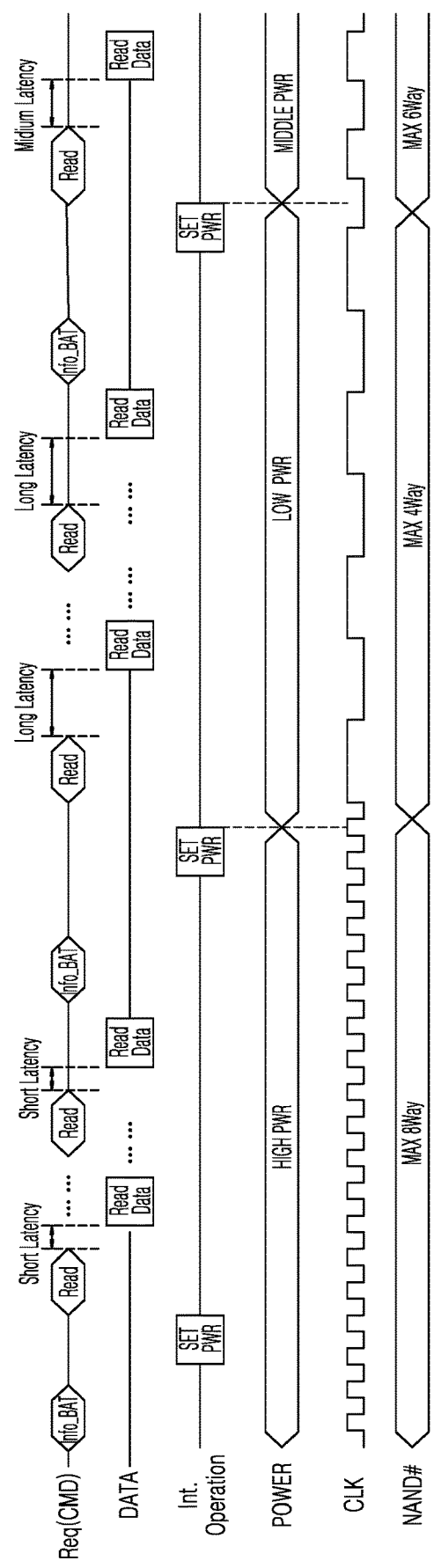
FIG. 8 is a signal waveform diagram of an example of an operation of the memory controller of FIG. 7.

FIG. 8 is a signal waveform diagram further illustrating operation of the control logic (e.g., a memory controller) of FIG. 7.

Referring to FIG. 8, a host may provide various requests and/or commands Req(CMD) to the memory system. As an example, the host may provide first battery information Info_BAT to the memory system, and the memory system may perform an internal power setting operation SET PWR in response to the first battery information Info_BAT. Assuming that the first battery information Info_BAT indicates that residual battery power is relatively high, the memory system may perform a first setting, operation such that the memory system operates in a relatively high power mode HIGH PWR and in accordance with entries of an initially communicated power table information Info_table.

Accordingly, since the memory system operates in the high power mode, one or more CAD signal(s) may be communicated a relatively short latency between the host and the memory system. For example, read data may be provided to the host after a relatively short latency in response to a read request communicated from the host. Further in this regard, a clock signal CLK controlling operation of the memory system may have a relatively high frequency, and a high number of NAND flash memory chips may be maximally and simultaneously accessed by the memory system (e.g., 8 out of 8 NAND flash chips, or MAX 8Way).

Subsequently, when the host updates the battery information Info_BAT to indicate relatively low residual battery power, the memory system may perform another internal power setting operation SET PWR in response to the updated battery information Info_BAT. For example, the memory system may perform a setting operation, such that memory system operates in a low power mode that consumes relatively low power LOW PWR. Accordingly, one or more CAD signal(s) may be communicated with a relatively long latency between the host and the memory system. For example, read data may be provided to the host after a relatively long latency in response to a read request communicated from the host. Furthermore, the clock signal CLK used to control the memory system may have a relatively low frequency, and a low number of NAND flash memory chips may be maximally and simultaneously accessed by the memory system (e.g., 4 of 8 NAND flash chips, or MAX 4Way).

Thereafter, assuming that the constituent battery of the memory system is at least partially recharged, the host may again update the battery information Info_BAT to indicate an intermediate (or middle) residual battery power. And in response, the memory system may again perform the internal power setting operation SET PWR. For example, the memory system may perform a setting operation, such that the memory system operates in an intermediate power mode that consumes an intermediate level of power (e.g. MIDDLE PWR). Accordingly, one or more CAD signal(s) may be communicated with an intermediate (or middle) latency between the host and the memory system. For example, read data may be provided to the host after the middle latency in response to a read request from the host. In addition, the clock signal CLK used to control operation of the memory system may have an intermediate (or middle) frequency, and an intermediate number of NAND flash memory chips may be maximally and simultaneously accessed by the memory system (e.g., 6 of 8 NAND flash chips, or MAX 6Way).

Figure 9:
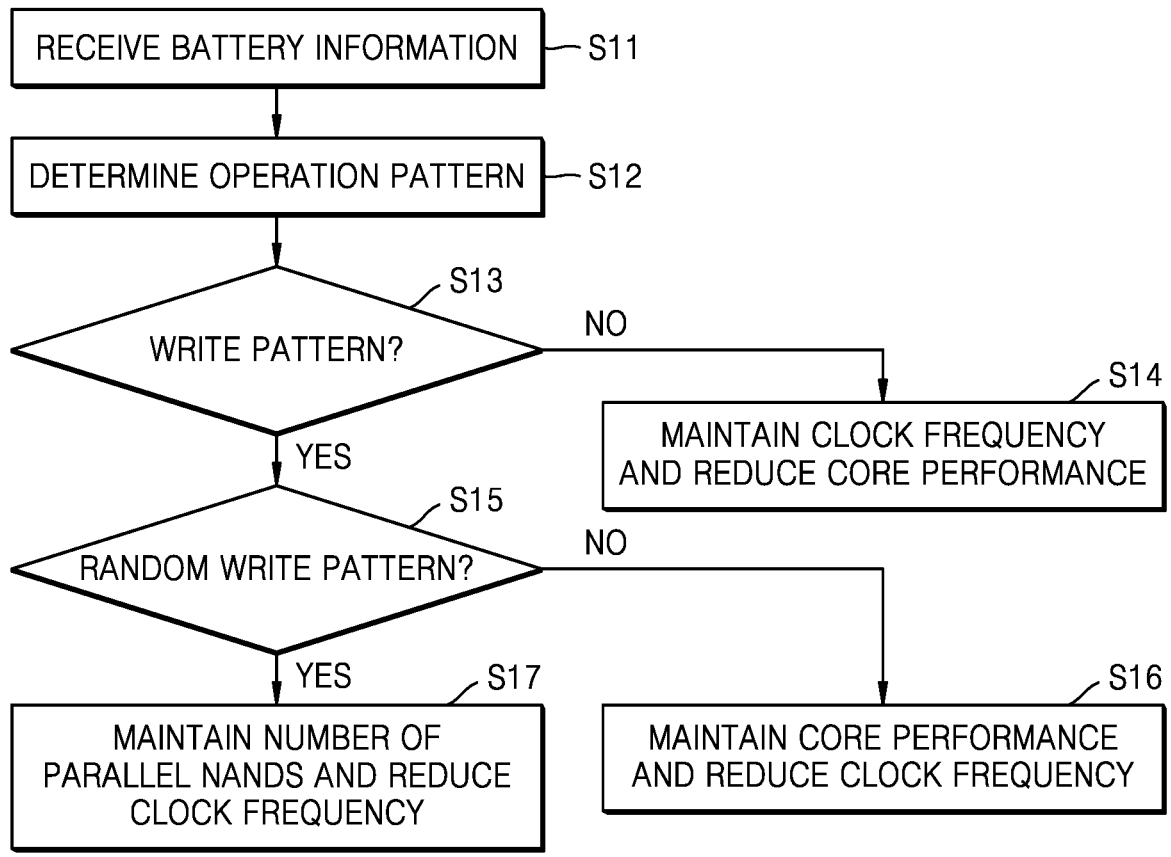
FIG. 9 is a flowchart of an operating method of a memory system, according to an example embodiment.

FIG. 9 is a flowchart illustrating an operating method for a memory system according to an embodiments of the inventive concept. Here, the operating method of FIG. 9 may control power consumption of a memory system by variously adjusting operating characteristics of constituent components within the memory system. Further, the operating method of FIG. 9 assumes that even under circumstances wherein maximum and/or average power consumption values for the memory system have been reduced in response to declining residual battery power, performance degradation of the memory system may nonetheless be minimized.

In the operating method, the memory system may receive from the host power table information Info_table and battery information Info_BAT indicating at least residual battery power (S11). Here, it is assumed that a maximum power consumption value and/or an average power consumption value for memory system has been reduced when a battery step indicated by the received battery information Info_BAT is lower than a current battery step.

Accordingly, the memory system may perform one or more memory operations (e.g., read operation(s), random write operation(s), a sequential write operation, etc.) as indicated by received request(s) from the host, and determine an "operation pattern" for the memory system (S12). That is, taking into consideration (or looking forward) a number of data access operations currently being executed or currently queued for execution, the memory system may determine a corresponding operation pattern (e.g., a read pattern, a random write pattern, a sequential write pattern, etc.).

In this regard, the memory system may determined whether pending data access operations are consistent with a write pattern (S13). If the pending data access operations are not consistent with a write pattern (S13=NO), the memory system control various components (e.g., a clock generator and a CPU core) to maintain the clock signal CLK frequency and reduce core performance (S14). Thus, assuming one or more read operation(s) are pending in the memory system, possible performance degradation of the memory system may be best prevented by maintaining clock signal frequency. Accordingly, some other power consumption factor(s) (e.g., core performance) may be adjusted to effectively reduce memory system power consumption. In some embodiments, however, even when the clock signal frequency is reduced, a power setting operation may be performed that reduces the clock signal frequency during the read operation less than during a write operation.

However, if the pending data access operations are consistent with a write pattern (S13=YES), the memory system may make another determination as to whether the pending data access operation(s) are consistent with a random write pattern (S15). If the pending data access operation(s) are consistent with a write pattern, but are not consistent with a random write pattern (S15=NO), then the pending data access operation(s) are consistent with a sequential write pattern, and the memory system may maintain core performance and reduce the clock signal frequency (as one possible approach to reducing clock performance) (S16).

Alternately, if the pending data access operation(s) are consistent with a random write pattern (S15=YES), then the memory system may maintain a maximum number of NAND flash chips that may be accessed in parallel and reduce the clock signal frequency (S17). That is, respective memory system performance factors (e.g., CPU core performance, clock signal frequency, maximum number of parallel-accessed memory chips, etc.), together with corresponding power consumption characteristics may be traded off in relation to various operation patterns for the memory system.

Figure 10:
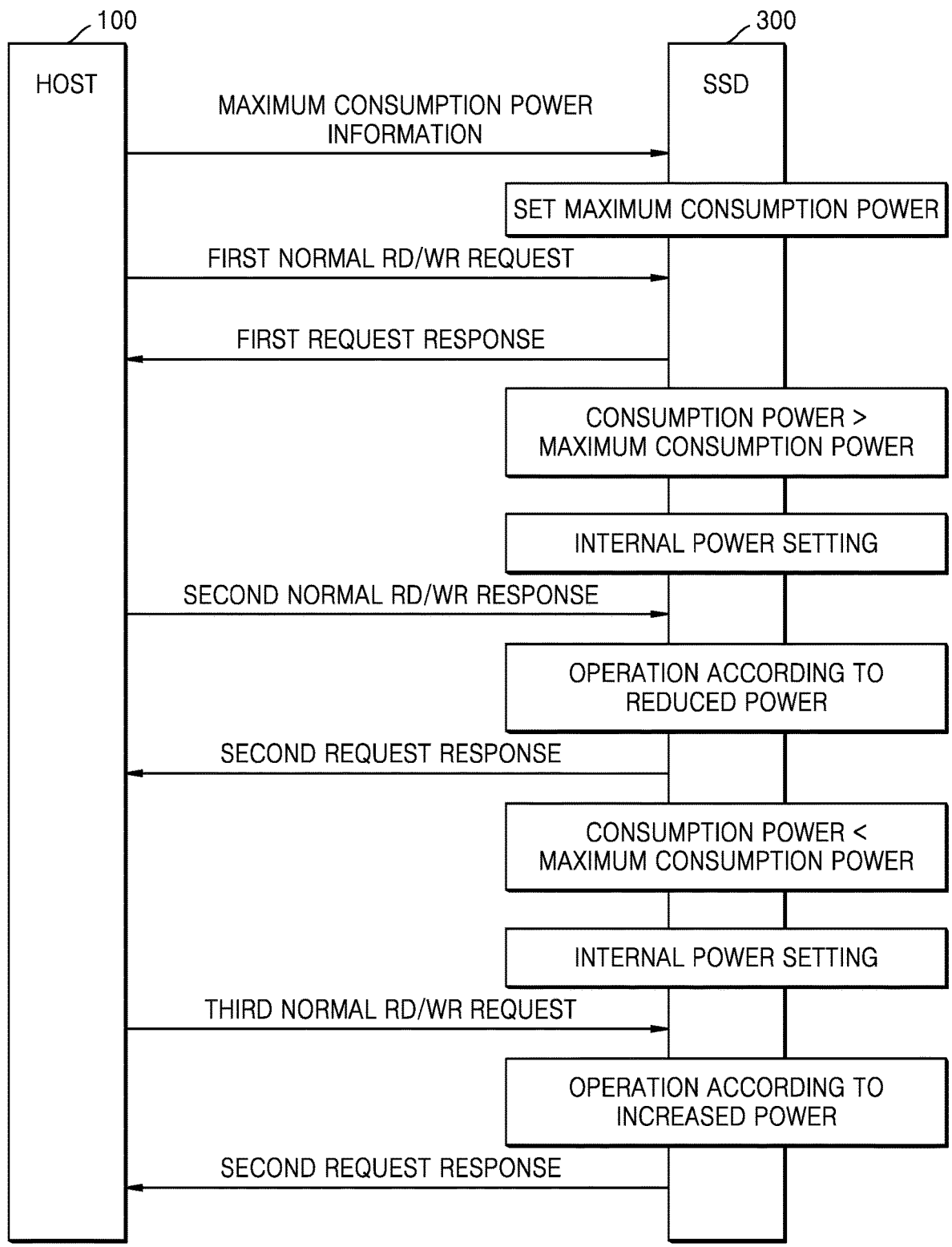
FIG. 10 is a diagram of an example of an operation of an electronic device including a memory system, according to an example embodiment.

FIG. 10 is a another conceptual diagram illustrating an exemplary exchange of information and CAD signal(s) between the host 100 and the memory system 200 (or the SSD 300) according to embodiments of the inventive concept, and may be compared with FIG. 5.

Referring to FIGS. 1 and 10, upon initial power-up the electronic device 10, the host 100 may communicate maximum consumption power information for the memory system 220 (e.g., the SSD 300 of FIG. 3). Here, "maximum consumption power information" may be variously defined and may generally indicate a maximum consumption power value for the SSD 300 as a whole and/or maximum consumption power values for components within the SSD 300. However, generally speaking, relatively high maximum consumption power information may correspond to the SSD 300 operating in a high performance mode, while relatively low maximum consumption power information may correspond to the SSD 300 operating in a low performance mode.

In response to the maximum consumption power information received from the host 100, the SSD 300 may set maximum consumption power values for various constituent components (e.g., a CPU core, a clock generator, a number of memory chips, etc.).

In some embodiments, the SSD 300 may set maximum consumption power values for each of the components within a range defined by the maximum consumption power information for the SSD 300 as a whole. In this regard, the maximum consumption power values for the various components may be set based according to a number of power consumption factors, such as for example, a performance level for the SSD 300, type(s) of constituent memory chips, size of constituent memory chips, number of constituent memory chips, etc.

Once the maximum consumption power information has been set within the SSD 300, the host 100 may communicate a first normal read/write request to the SSD 300. In response, the SSD 300 may perform a memory operation corresponding to the first normal read/write request and communicate (or return a first request response to the host 100.

The SSD 300 may periodically or asynchronously determine whether consumption power for the SSD 300 exceeds the maximum consumption power value. If so, an internal power setting operation may be performed that reduces power consumption by the SSD 300.

Thereafter, the host 100 may communicate a second normal read/write request to the SSD 300. In response, the SSD 300 may perform a memory operation corresponding to the second normal read/write request and communicate a second request response to the host 100. However, because power consumption for the SSD 300 has been reduced by the internal power setting operation, the SSD 300 may perform the memory operation using reduced power when generating the second request response. In this regard, the second request response may requires a longer latency than the first request response.

Therefore, assuming a determination that the consumption power by the SSD 300 does not exceeds the maximum consumption power value, the SSD 300 may again perform the internal power setting operation to increase maximum power consumption by the SSD 300.

Thereafter, the host 100 may communicate a third normal read/write request to the SSD 300. In response, the SSD 300 may perform a memory operation in response to the third normal read/write request and communicate a third request response to the host 100. However, because power consumption by the SSD 300 has been increased by the internal power setting operation, the SSD 300 may perform the memory operation with increased power consumption to generate the third request response with a reduced latency. That is, the third request response may be communicated with a shorter latency than the second request response.

Figure 11:
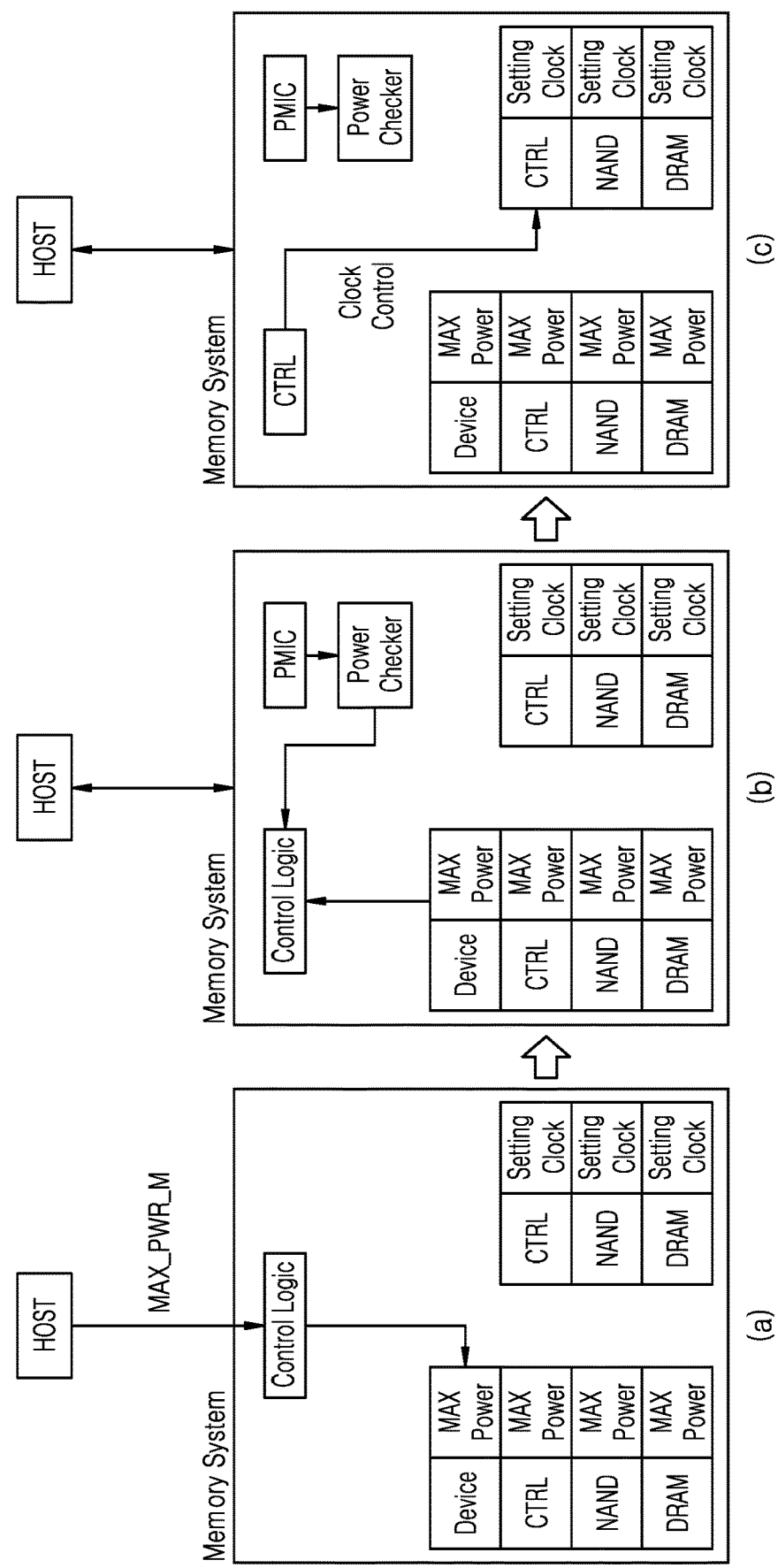
FIG. 11 is a block diagram of an example of a power control operation of a memory controller shown in FIG. 10.

FIG. 11, including collectively FIGS. 11(a), 11(b), and 11(c), illustrating power control operations that may be performed by control logic according to embodiments of the inventive concept.

As shown in FIG. 11(a), a memory system may receive maximum consumption power information MAX_PWR_M) indicating maximum consumption power values for the memory system and/or constituent components from a host (HOST), without the memory system first communicating maximum power information to the host. In this regard, a maximum consumption power value for each component of the memory system may be derived from the maximum consumption power information MAX_PWR_M received from the host using control logic (e.g., a memory control or CPU core) available to the memory system. Here again, the illustrated example of FIG. 11 assumes the use of at least one maximum consumption power value for the control logic, at least one NAND chip, and at least one DRAM.

Moreover, as shown in FIG. 11(b), the memory system may further include a power management integrated circuit (PMIC) and a power checker (e.g., a power detector), wherein the PMIC and power checker may be used to monitor and control power consumed by the memory system. In some embodiments, the PMIC may control the provision of power to each component, and the power detector may be used to monitor (or detect) the level of power provided by the PMIC to the various components.

Under the control of the control logic, a determination is made as to whether power consumption by the memory system exceeds the maximum consumption power information MAX_PWR_M provided by the host. In some embodiments, the control logic may perform a power control operation depending on whether power consumption by the memory system as a whole exceeds the maximum consumption power information MAX_PWR_M in accordance with power consumption by the components of the memory system. Alternately, the control logic may perform a power control operation depending on whether power consumption by each component of the memory system exceeds a corresponding maximum consumption power value for the component n accordance with power consumption by the memory system as a whole.

Thereafter, as shown in FIG. 11(*c*), power consumption by the memory system may be managed under the control of the control logic. For example, in FIG. 11C power consumption is managed by adjusting a clock signal frequency. Here, clock signal control may be performed such that a sum of power consumption values for each of the relevant components within the memory system does not exceed, in the aggregate, the maximum consumption power information MAX_PWR_M. Alternately, a clock signal control may be performed such that power consumption by each component of the memory system does not exceed a maximum consumption power value for the component.

Figure 12:
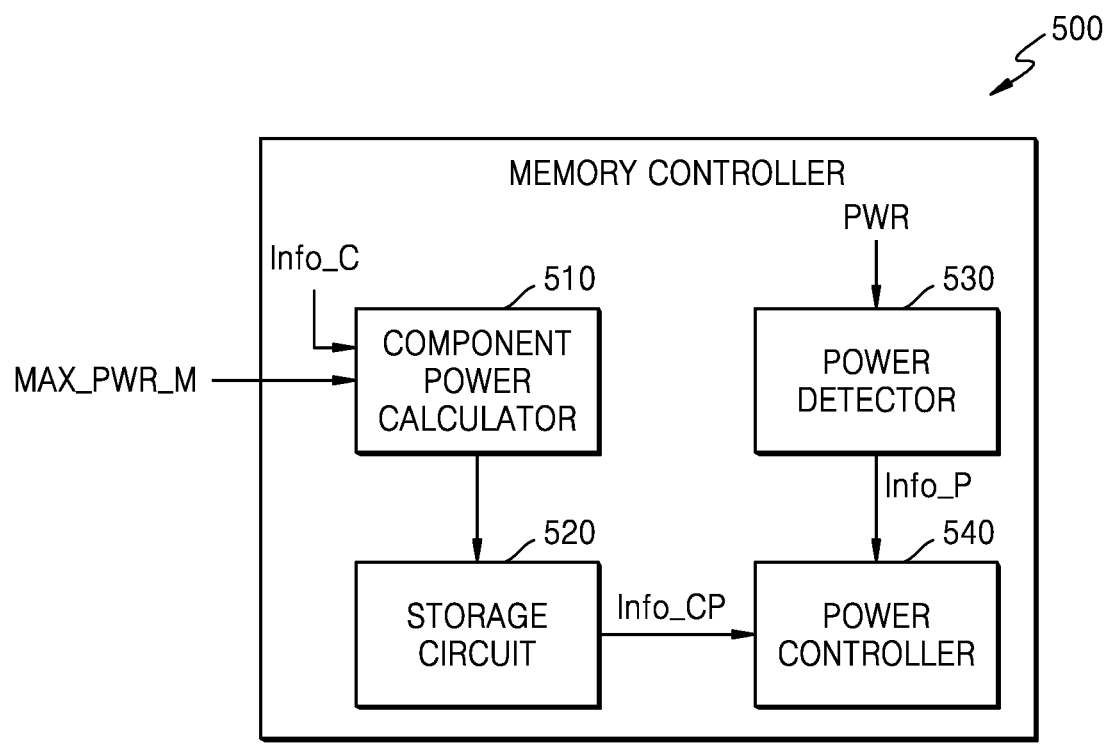
FIG. 12 is a block diagram of an embodied example of a memory controller according to an example embodiment.

FIG. 12 is a block diagram illustrating another possible example of a memory controller 500 according to embodiments of the inventive concept. Here, the memory controller 500 may be understood as one possible example of the memory controller 210 of FIGS. 1 and 2, the SSD controller 320 of FIG. 3, the memory controller 400 of FIG. 4, or the control logic of FIGS. 7 and 11.

Referring to FIG. 12, the memory controller 500 may include a component power calculator 510, a storage circuit 520, a power detector 530, and a power controller 540. The component power calculator 510 may receive the maximum consumption power information MAX_PWR_M and component power consumption information Info_C related to various components of the memory system from the host. The component power calculator 510 may then calculate a maximum consumption power value about each component in response to the maximum consumption power information MAX_PWR_M and the component power value information Info_C. The component power calculator 510 may also store the maximum consumption power information MAX_PWR_M received from the host and the maximum consumption power values for each component (e.g., power table information Info_table) in the storage circuit 520.

The power detector 530 may be used to detect various power signals provided by the PMIC and provide corresponding detection results, as "power information" Info_P to the power controller 540. The power controller 540 may then perform various control operation(s) that adjust power consumption on a component-by-component basis within the memory system in accordance with the power information Info_P provided by the power detector 530 and the power table information Info_table stored in the storage circuit 520. As before, power consumption for one or more of the components may be adjusted by varying a clock signal frequency, a performance level for a CPU core, a maximum number of memory chips that may be simultaneously access, etc. In some embodiments, the power controller 540 may be implemented separately from a CPU core. Alternately, the power controller 540 may be functionally implemented using the CPU core.

Figure 13:
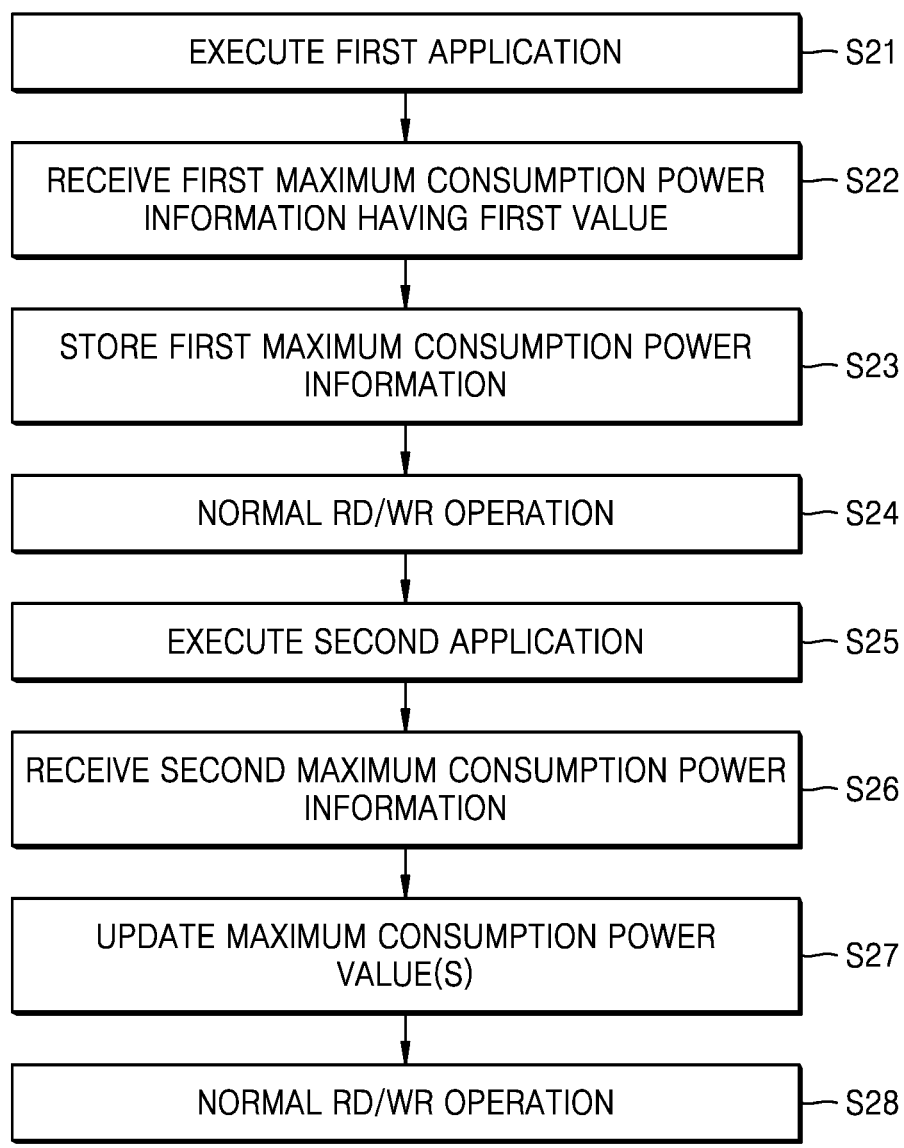
FIG. 13 is a flowchart of an operating method of an electronic device including a memory system, according to an example embodiment.

FIG. 13 is a flowchart illustrating an operating method for an electronic device including a memory system according to embodiments of the inventive concept. Here, the method of FIG. 13 assumes that the memory system may operate in either a low performance mode or a high performance mode depending on the nature of an application currently being executed by the electronic device. In this regard, maximum consumption power information for the memory system may be changed during runtime execution of an application.

Within the operating method of FIG. 13, the host may execute a first application (S21). Additionally, the host may determine performance required by the memory system according to execution of the first application, and set maximum consumption power information for the memory system accordingly. It follows that the host may communicate first maximum consumption power information to the memory system, and the memory system may receive the first maximum consumption power information (S22).

The memory system may set maximum consumption power values for various components within the memory system in accordance with the maximum consumption power information received from the host. In some embodiments, the maximum consumption power values may be stored as power table information Info_table in a memory associated with the memory system (S23).

Thereafter, the memory system may perform normal read/write operation(s) in an operative state that does not exceed one or more maximum consumption power value(s) (S24). In this regard, the memory system may detect power consumption and perform various control operation(s) adjusting power consumption for constituent components and/or the memory system as a whole.

Thereafter, it is assumed that the host terminates the first application and performs a second application different from the first application (S25). here, it is further assumed that the second application is characterized by different maximum consumption power information for the memory system. Accordingly, the memory system may receive second maximum consumption power information different from the first maximum consumption power information and stores the second maximum consumption power information in the memory associated with the memory system (S26).

At this point, the memory system may update a corresponding maximum consumption power value for one or more of the components of the memory system in accordance with the second maximum consumption power information (S27). Thereafter, the memory system may perform normal read/write operation(s) in an operative state that does not exceed maximum consumption power values consistent with the second maximum consumption power information (S28). Of note, different maximum consumption power values related to different maximum consumption power information may be used to define an appropriate performance profile for components of the memory system in relation to different applications being executed by the electronic device.

Figure 14:
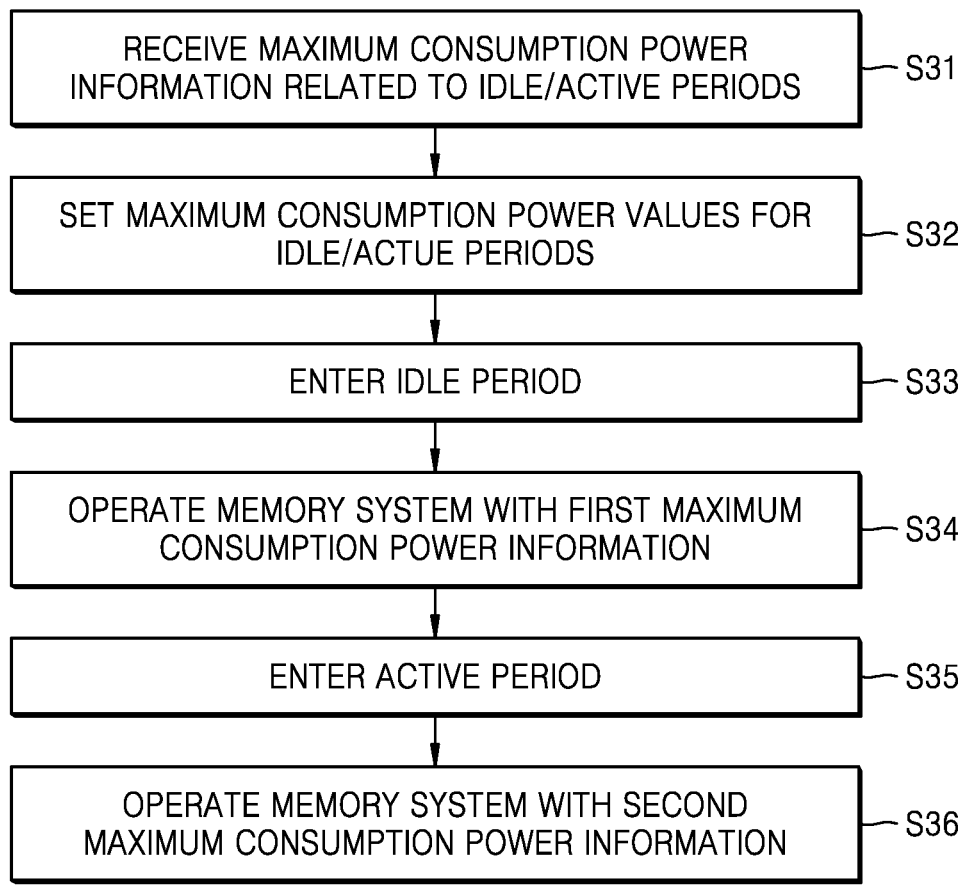
FIG. 14 is a flowchart of an operating method of a memory system, according to an example embodiment.

FIG. 14 is a flowchart illustrating another operating method for a memory system according to embodiments of the inventive concept.

Referring to FIG. 14, a host may communicate maximum consumption power information to a memory system, wherein the maximum consumption power information may variously relate idle period(s) for the memory system and/or active period(s) for the memory system. For example, the host may communicate first maximum consumption power information related to idle periods and second maximum consumption power information related to active periods. Upon receipt of the first maximum consumption power information and the second maximum consumption power information from the host, the memory system may store the first maximum consumption power information and the second maximum consumption power information in an associated memory (S31).

The memory system may then set respective maximum consumption power values for various components of the memory system in relation to the first maximum consumption power information and the second maximum consumption power information (S32). That is, the memory system may set first maximum consumption power values for each component in relation to idle period, and second maximum consumption power values for each component in relation to the active period.

Upon entering the idle period (e.g., a period of time wherein the memory system does not access data or accesses the data at a low frequency), the memory system requires only relatively low performance (S33), and the memory system may be operated in accordance with the first maximum consumption power information associated with the idle period (S34).

In this regard, the memory system may perform power control operation(s) by referring to table information including maximum power information values for various components in relation to the idle period. For example, the memory system may reduce power consumption by (e.g.,) deactivating a clock signal provided to certain components during the idle period.

Thereafter, when the memory system enters the active period (e.g., a period of time wherein the memory system accesses data above a threshold frequency), the memory system requires relatively high performance (S35), and the memory system may be operated in accordance with the second maximum consumption power information associated with the active period (S36).

In this regard, the memory system may perform power control operation(s) by referring to table information including maximum consumption power information values for various components in relation to the active period. For example, the memory system may increase overall power consumption by the memory system by activating a clock signal provided to certain components during the active period.

Figure 15:
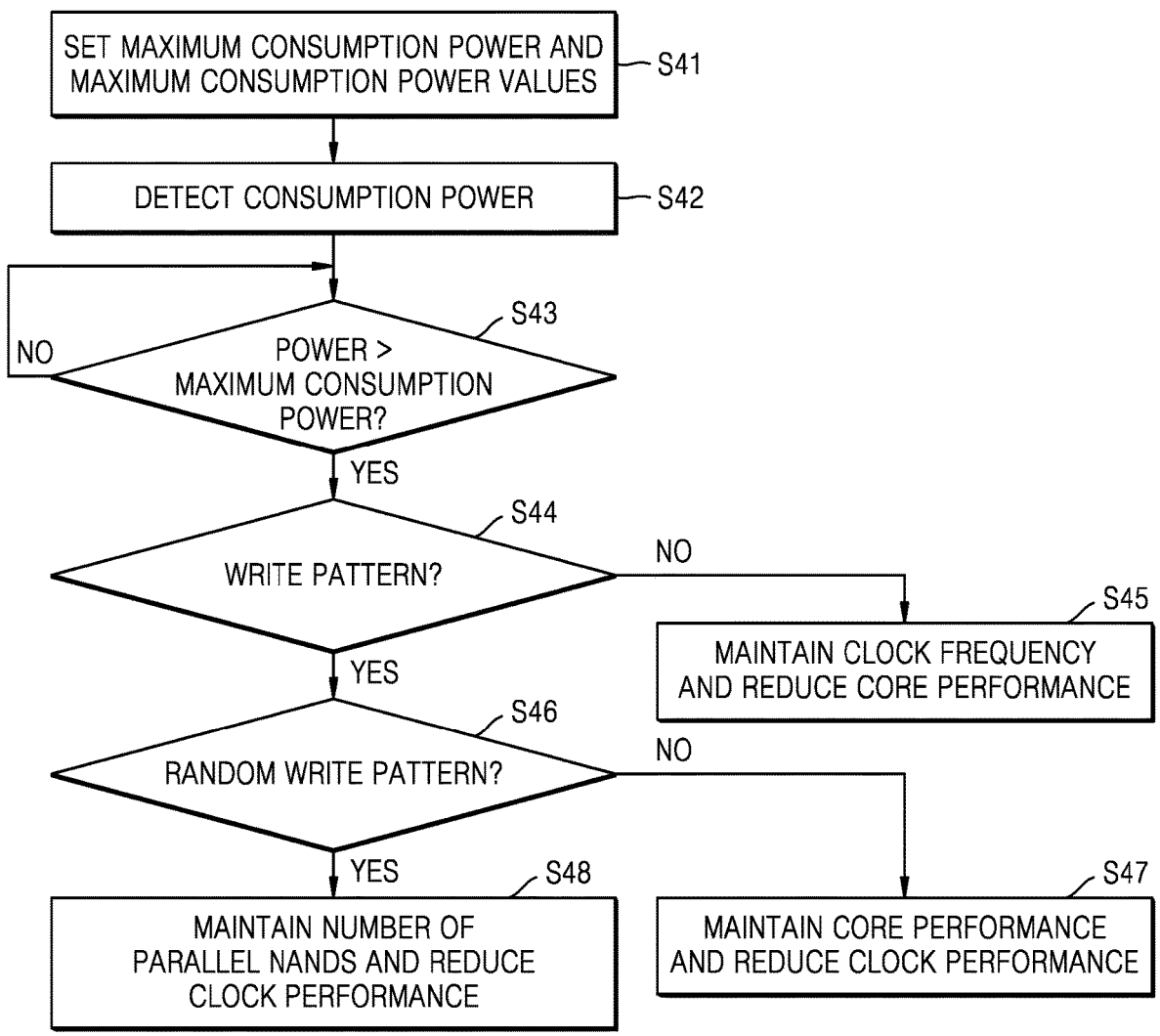
FIG. 15 is a flowchart of an operating method of a memory system, according to an example embodiment.

FIG. 15 is a flowchart illustrating still another operating method for a memory system according to an embodiments of the inventive concept, and may be compared with the flowchart of FIG. 9.

Referring to FIG. 15, the memory system may set maximum consumption power for the memory system in response to maximum consumption power information received from a host, and then set maximum consumption power values for relevant components within the memory system (S41).

Thereafter, the memory system may periodically or asynchronously detect power signals to determine power consumption by the memory system (S42), and determine whether the consumption power exceeds the maximum consumption power (S43).

Upon determining that consumption power by the memory system exceeds the maximum power (S43=YES), the memory system may begin a power reduction routine including method steps: S44; S45; S46; S47 and S48, which are respectively similar to method steps: S13; S14; S15; S16 and S17 of the method previously described in relation to FIG. 9.

Figure 16:
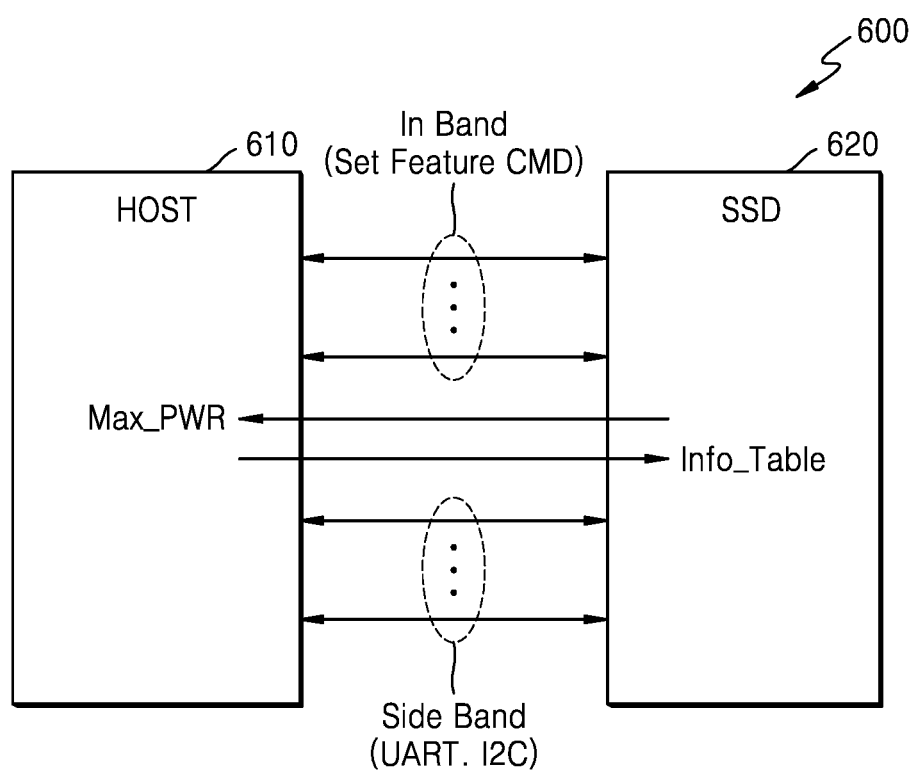
FIG. 16 is a diagram of an example in which a host communicates with a memory system using various kinds of commands.

FIG. 16 is a block diagram illustrating various communications between a host 610 and SSD 620 according to embodiments of the inventive concept. Here, one or more of the communications may be performed using an in-band command or a side-band command.

Referring to FIG. 16, the host 610 and the SSD 620 may be connected through a number of communications channels including at least one channel for an in-band command communication and at least one channel for a side-band command communication. Here, the SSD 620 may communicate maximum power information MAX_PWR to the host 610 and the host 610 may communicate power table information Info_table to the SSD 620 consistent with the embodiment described in relation to FIG. 1.

Various data access operations (e.g., write and read operations) may be performed by the SSD 620 via the in-band command communication(s). Various information described above in relation to certain embodiments of the inventive concept may be communicated via in-band command communication(s). In this regard, various types of commands may be defined between the host 610 and the SSD 620. For example, transmission of information may be controlled in response to various set feature command(s) defined in accordance with relevant technical standards associated with an NVMe interface. Alternately, various information may be communicated via side-band command communication(s). For example, information may be communicated using various communication methods, such as universal asynchronous receiver/transmitter (UART) communication or Inter-Integrated Circuit (I2C) communication.

Figure 17:
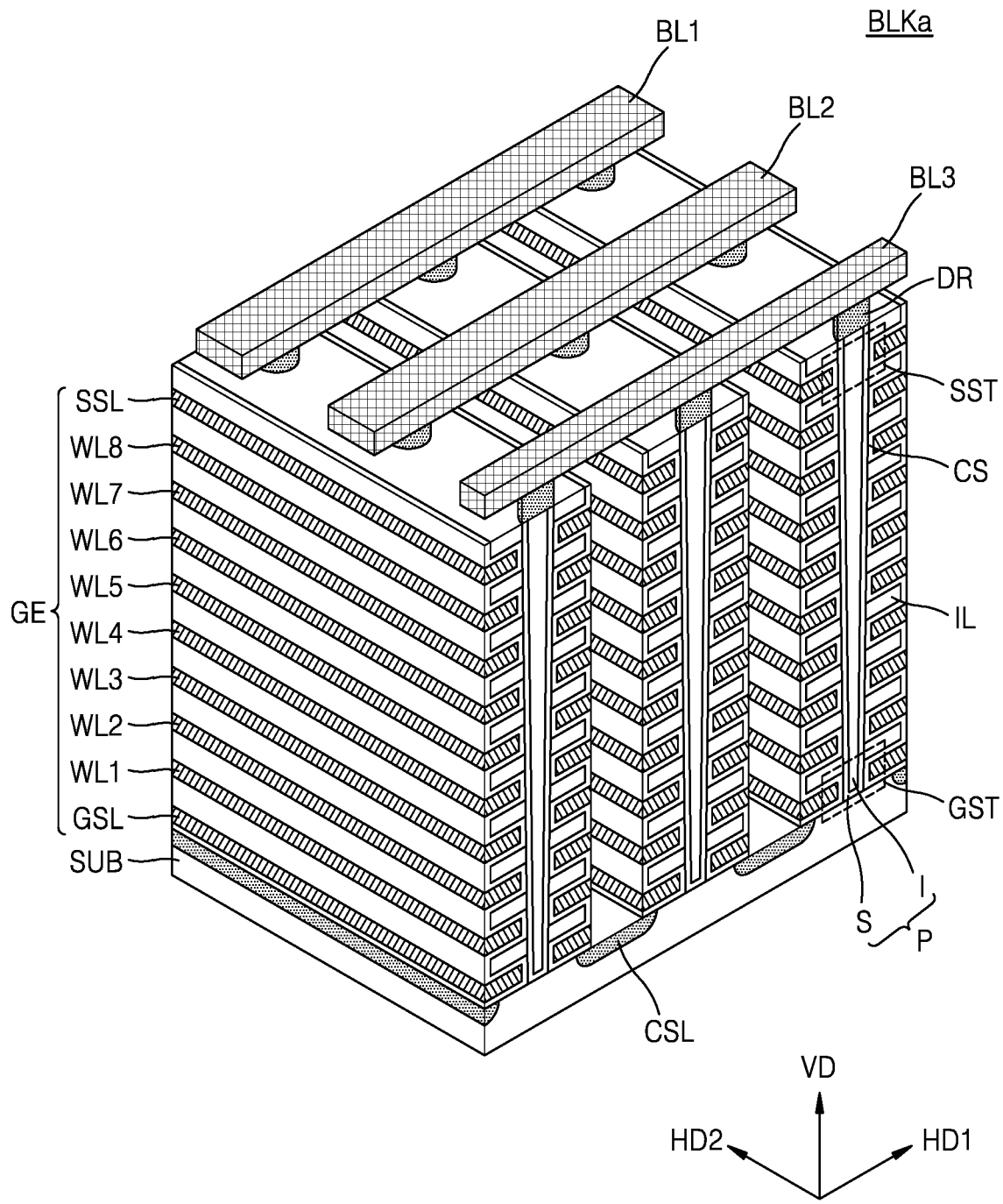
FIG. 17 is a perspective view of a memory block included in a memory system, according to an embodiment.

FIG. 17 is a perspective view illustrating in one example a memory block that may be included in a memory system according to embodiments of the inventive concept. For example, the memory block of FIG. 17 may correspond to one of a plurality of memory blocks forming a memory cell array for the memory device 200 of FIG. 1. In this regard, FIG. 17 illustrates a memory block that may be used to implement a three-dimensional (3D) NAND (or VNAND).

Referring to FIG. 17, a memory block BLKa may be formed in a vertical direction VD to a substrate SUB. The substrate SUB may be of a first conductivity type (e.g., p type) and extend in a second lateral direction HD2 on the substrate SUB. In an embodiment, a common source line CSL doped with impurities of a second conductivity type (e.g., n type) may be provided in the substrate SUB. In an embodiment, the substrate SUB may be implemented as polysilicon, and a common source line CSL of a plate type may be on the substrate SUB. On the substrate SUB, a plurality of insulating films IL may extend in the second lateral direction HD2 and be sequentially provided in the vertical direction VD, and the plurality of insulating films IL may be a predetermined distance apart from each other in the vertical direction VD. For example, the plurality of insulating films IL may include an insulating material, such as silicon oxide.

On the substrate SUB, a plurality of pillars P may be sequentially arranged in a first lateral direction HD1 and pass through the plurality of insulating films IL in the vertical direction VD. For example, the plurality of pillars P may be brought into contact with the substrate SUB by passing through the plurality of insulating films IL. Specifically, a surface layer S of each of the pillars P may include a silicon material of a first type and function as a channel region. Therefore, in some embodiments, the pillar P may be referred to as a channel structure or a vertical channel structure. Moreover, an inner layer I of each of the pillars P may include an insulating material (e.g., silicon oxide) or an air gap.

A charge storage layer CS may be provided along exposed surfaces of the insulating films IL, the pillars P, and the substrate SUB. The charge storage layer CS may include a gate insulating layer (or also referred to as a 'tunneling insulating layer'), a charge trap layer, and a block insulating layer. For example, the charge storage layer CS may have an oxide-nitride-oxide (ONO) structure. On an exposed surface of the charge storage layer CS, gate electrodes GE, such as a ground selection line GSL, a string selection line SSL, and word lines WL1 to WL8, may be provided.

Drain contacts or drains DR may be provided on the plurality of pillars P, respectively. For example, the drains DR may include a silicon material doped with impurities of the second conductivity type. On the drains DR, bit lines BL1 to BL3 may extend in the first lateral direction HD1 and be a predetermined distance apart from each other in the second lateral direction HD2.

Figure 18:
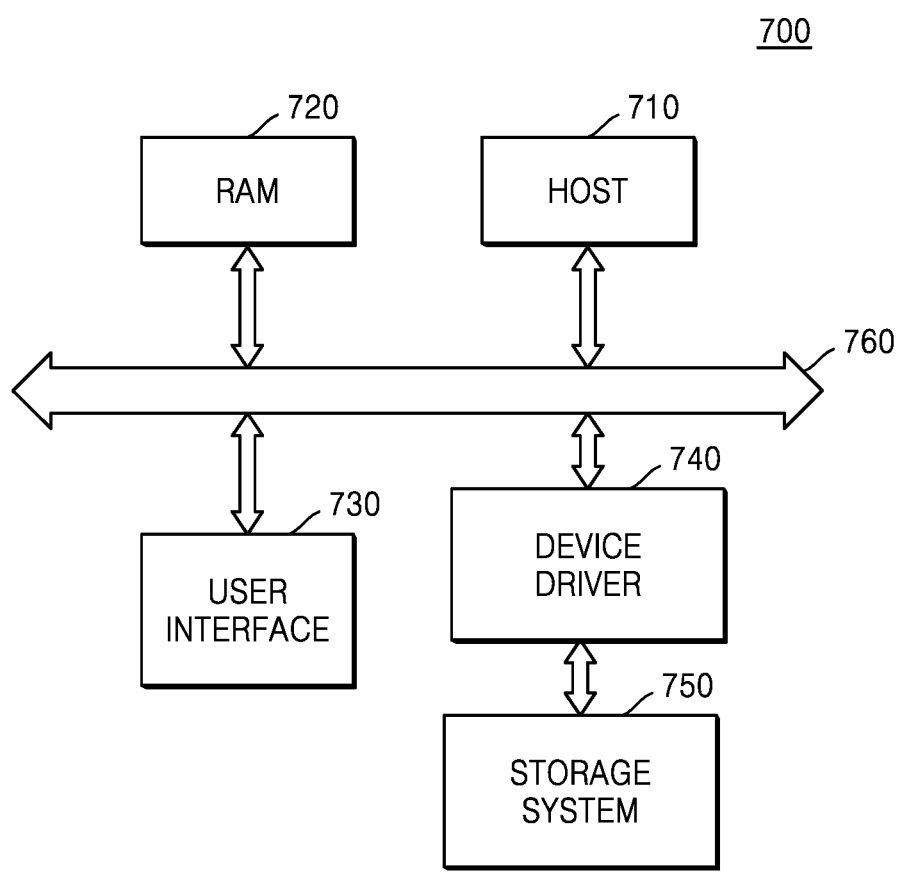
FIG. 18 is a block diagram of a data processing system including a memory system, according to embodiments.

FIG. 18 is a block diagram illustrating a data processing system 700 including a memory system according to embodiments of the inventive concept. Here, the data processing system 700 may be variously implemented as an electronic device, a mobile device, a desktop computer), etc.

The data processing system 700 may include a host 710 including an application processor (AP), RAM 720, a user interface 730, and a device driver 740, each of which is electrically connected to a bus 760, and the storage system 750 may be connected to the device driver 740. The host 710 may control all operations of the data processing system 700 and perform a processing operation corresponding to a user's command, which is input through the user interface 730. The RAM 720 may serve as a data memory of the host 710, and the host 710 may write or read data to and from the storage system 750 through the device driver 740. Although FIG. 18 illustrates a case in which the device driver 740 configured to control the operation and management of the storage system 750 is outside the host 710, the device driver 740 may be inside the host 710.

While the inventive concept has been particularly shown and described with reference to embodiments thereof, it will be understood that various changes in form and details may be made therein without departing from the scope of the inventive concept, as defined by the following claims.

What is claimed is:

1. An operating method for a memory system, the operating method comprising:
transmitting, to a host via a host interface, maximum power information and step information;
receiving, from the host via the host interface, power table information and battery information in response to the maximum power information and the step information; and
controlling power consumption by a component of the memory system in response to a maximum consumption power value of the memory system,
wherein the power table information is related to a battery associated with the memory system and configured to operate in accordance with a plurality of battery steps,
wherein the power table information includes a number of entries including a first entry and a second entry,
wherein the first entry comprises a first battery step among the plurality of battery steps and is associated with a first maximum consumption power value that comprises a difference between the maximum power consumption value of the memory system and a first maximum power offset corresponding to the first battery step, and
wherein the second entry comprises a second battery step among the plurality of battery steps and is associated with a second maximum consumption power value that comprises a difference between the maximum power consumption value of the memory system and a second maximum power offset corresponding to the second battery step, and
wherein the maximum consumption power value used to control power consumption by the component of the memory system is one of the first maximum consumption power value and the second maximum consumption power value.

2. The operating method of claim 1,
wherein the battery information defines the plurality of battery steps in relation to the step information, and
wherein each battery step among the plurality of battery steps is defined in relation to a respective range of residual power for the battery.

3. The operating method of claim 1, wherein the controlling of power consumption by the component of the memory system in response to one of the first maximum consumption power value and the second maximum consumption power value prevents the memory system from exceeding a maximum power consumption determined in relation to the maximum power information.

4. The operating method of claim 1, wherein the controlling of power consumption by the component of the memory system in response to one of the first maximum consumption power value and the second maximum consumption power value includes:
determining an operation pattern for the memory system; and
adjusting power consumption by the component of the memory system in accordance with the operation pattern.

5. The operating method of claim 4, wherein the adjusting of power consumption by the component of the memory system in accordance with the operation pattern includes:
maintaining a clock signal frequency and reducing a central processing unit (CPU) core performance when the operation pattern is not a write pattern;
maintaining CPU core performance and reducing the clock signal frequency when the operation pattern is a write pattern other than a random write pattern; and
maintaining a maximum number of memory chips simultaneously accessed during a data access operation and reducing the clock signal frequency, when the operation pattern is a random write pattern.

6. The operating method of claim 1, wherein each entry among the number of entries respectively corresponds to a different battery step among the plurality of battery steps.

7. The operating method of claim 6,
wherein the first entry includes the first maximum consumption power value and a first average consumption power value, and
wherein the controlling of power consumption by the component of the memory system includes adjusting power consumption by the component of the memory system in accordance with at least one of the first maximum consumption power value and the first average consumption power value.

8. The operating method of claim 1,
wherein the memory system includes a central processing unit (CPU) core and NAND memory chips, and
wherein the controlling of power consumption by the component of the memory system includes at least one of adjusting a clock signal frequency, adjusting CPU core performance, and adjusting a number of the NAND memory chips simultaneously accessed during a data access operation.

9. The operating method of claim 8, wherein the power table information includes power table information for the CPU core and power table information for the NAND memory chips.

10. An operating method for a memory system, the operating method comprising:
- transmitting, to a host via a host interface, maximum power information and step information;
- receiving, from the host via the host interface, information on device maximum consumption power from the host via the host interface, the device maximum consumption power to be consumed by the memory system;
- calculating, based on the information on the device maximum consumption power, information on component maximum consumption power to be consumed by one or more components included in the memory system;
- storing, as step entries of power table information, the information on the device maximum consumption power and the information on the component maximum consumption power, wherein each step entry of the power table information comprises a difference between the device maximum consumption power and a maximum power offset corresponding to the step entry of the power table information;
- detecting power consumed by the memory system; and
- reducing, based upon one of the step entries of the power table information, power consumed by the memory system when the detected power exceeds the information on the device maximum consumption power.

11. The operating method of claim 10,
wherein the memory system comprises a memory controller and a memory device, the memory controller comprises a volatile memory, and the memory device comprises a plurality of NAND memory chips, and
wherein the one or more components comprise at least one of the memory controller, the volatile memory, and the NAND memory chips.

12. The operating method of claim 11, wherein the reducing of the power comprises reducing a frequency of a clock signal provided to at least one of the memory controller, the volatile memory, and the NAND memory chips.

13. The operating method of claim 10, wherein the reducing of the power comprises adjusting power such that power simultaneously consumed by the one or more components does not exceed the information on the maximum consumption power.

14. The operating method of claim 10, further comprising an operation pattern of the memory system,
wherein, when the operation pattern of the memory system corresponds to a read operation, a clock frequency of the memory system is maintained constant while the power consumed by the memory system is reduced.

15. The operating method of claim 10,
wherein the memory system comprises a memory device, and the memory device comprises a plurality of NAND flash chips,
wherein the operating method further comprises determining an operation pattern of the memory system, and
wherein, when the operation pattern of the memory system corresponds to a random write pattern, a number of the plurality of NAND flash chips accessed simultaneously is maintained constant while the power consumed by the memory system is reduced.

16. The operating method of claim 10,
wherein the memory system comprises a memory controller, and the memory controller comprises a CPU core,
wherein the operating method further comprises determining an operation pattern of the memory system,
wherein, when an operation pattern of the memory system corresponds to a sequential write pattern, performance of the CPU core is maintained constant while the power consumed by the memory system is reduced.

17. A memory controller of a memory system, the memory controller comprising:
- a central processing unit (CPU) core configured to control performance of a data access operation by the memory system; and
- a storage circuit configured to store battery power table information, wherein the battery power table information includes a plurality of entries, each entry among the plurality of entries is related to a battery step among a plurality of battery steps, each battery step among the plurality of battery steps is related to a range of residual battery power for a battery associated with the memory system and comprises a difference between a maximum power consumption value of the memory system and a maximum power offset corresponding to the battery step;
- wherein the memory controller is further configured to transmit, to a host device via a host interface, maximum power information and step information, receive, from the host via the host interface, the battery power table information in response to the maximum power information and the step information, and adjust power consumption by the memory system in relation to at least one of the maximum consumption power value and an average consumption power value defined in accordance with at least one entry among the plurality of entries of the battery power table information.

18. The memory controller of claim 17, wherein the memory controller is further configured to receive the battery power table information from the host in response to an in-band command of the memory system, and receive a read/write request from the host in response to a side-band command of a universal asynchronous receiver/transmitter (UART) or an inter-integrated circuit (I2C).

19. The memory controller of claim 17, wherein as operation of the battery transitions from one battery step to another battery step due to declining residual battery power of the battery, the memory controller is further configured to receive updated battery information from the host.

* * * * *